United States Patent
Shelor

(10) Patent No.: US 8,125,741 B2
(45) Date of Patent: Feb. 28, 2012

(54) ROTATIONAL, SHEAR MODE, PIEZOELECTRIC MOTOR INTEGRATED INTO A COLLOCATED, ROTATIONAL, SHEAR MODE, PIEZOELECTRIC MICRO-ACTUATED SUSPENSION, HEAD OR HEAD/GIMBAL ASSEMBLY FOR IMPROVED TRACKING IN DISK DRIVES AND DISK DRIVE EQUIPMENT

(75) Inventor: John R. Shelor, San Diego, CA (US)

(73) Assignee: Magnecomp Corporation, Murrieta, CA (US)

( * ) Notice: Subject to any disclaimer, the term of this patent is extended or adjusted under 35 U.S.C. 154(b) by 1182 days.

(21) Appl. No.: 11/880,179

(22) Filed: Jul. 20, 2007

(65) Prior Publication Data
US 2009/0021857 A1 Jan. 22, 2009

(51) Int. Cl.
G11B 21/02 (2006.01)
G11B 5/596 (2006.01)
(52) U.S. Cl. .................................... 360/294.4
(58) Field of Classification Search ............... 360/294.4, 360/294.1, 294.3
See application file for complete search history.

(56) References Cited

U.S. PATENT DOCUMENTS

| | | | | |
|---|---|---|---|---|
| 4,775,815 A * | 10/1988 | Heinz | ............... | 310/328 |
| 5,022,272 A * | 6/1991 | Bronowicki et al. | ............... | 73/772 |
| 5,027,028 A * | 6/1991 | Skipper | ............... | 310/328 |
| 5,043,621 A * | 8/1991 | Culp | ............... | 310/316.02 |
| 5,473,245 A | 12/1995 | Silvus, Jr. et al. | | |
| 5,521,778 A * | 5/1996 | Boutaghou et al. | ............... | 360/264.5 |
| 5,801,908 A * | 9/1998 | Akiyama et al. | ............... | 360/294.4 |
| 6,020,674 A * | 2/2000 | Zhang et al. | ............... | 310/333 |
| 6,246,552 B1 * | 6/2001 | Soeno et al. | ............... | 360/294.4 |
| 6,310,750 B1 * | 10/2001 | Hawwa et al. | ............... | 360/294.6 |
| 6,313,566 B1 * | 11/2001 | Cunningham et al. | ............... | 310/328 |
| 6,327,120 B1 | 12/2001 | Koganezawa | | |
| 6,376,964 B1 * | 4/2002 | Young et al. | ............... | 310/311 |

(Continued)

FOREIGN PATENT DOCUMENTS

WO WO/2009044489 A1 9/2009

OTHER PUBLICATIONS

Shinji Koganezawa, Development of a Shear Mode Piezoelectric Micro-actuator for Precise Head Positioning, Fujitsu Sci. Tech Journal, 37,2,p. 212-219,Dec. 2001, Japan.

*Primary Examiner* — Brian Miller
(74) *Attorney, Agent, or Firm* — Intellectual Property Law Offices of Joel Voelzke, APC

(57) ABSTRACT

A rotational, shear mode, piezoelectric motor is integrated with a suspension, head or head gimbal assembly (HGA) into a collocated, rotational, shear mode, piezoelectric micro-actuated suspension, head or head gimbal assembly (HGA) for use in disk drives and disk drive manufacturing equipment. When excited by a control voltage, the collocated, shear mode, piezoelectric micro-actuated HGA rotates the head enabling high frequency, high resolution track positioning of the read/write element. The motor is integrated with the head and flexure (collocation). The head rotates about a rotation axis that is ideally located at the center of mass of the head. A shear mode piezoelectric motor rotates the head. A collocated, rotational, shear mode, piezoelectric micro-actuated HGA has high stiffness, high frequency response, high positioning resolution, low mass and low internal vibration for improved tracking, increased track density and greater disk drive storage capacity. Furthermore, its solid integration improves shock resistance and reduces micro-contamination.

14 Claims, 20 Drawing Sheets

U.S. PATENT DOCUMENTS

| | | |
|---|---|---|
| 6,704,158 B2 | 3/2004 | Hawwa et al. |
| 6,760,196 B1 * | 7/2004 | Niu et al. .................. 360/294.6 |
| 7,307,372 B2 * | 12/2007 | Uchino et al. ............... 310/333 |
| 7,375,911 B1 * | 5/2008 | Li et al. ......................... 360/75 |
| 7,630,175 B2 * | 12/2009 | Yamazaki et al. ......... 360/294.4 |
| 7,940,490 B2 * | 5/2011 | Shelor ...................... 360/78.05 |
| 2003/0001457 A1 * | 1/2003 | Wang et al. .................. 310/328 |
| 2004/0061969 A1 * | 4/2004 | Yang et al. ................ 360/78.05 |
| 2004/0125511 A1 * | 7/2004 | Yang et al. ................ 360/294.4 |
| 2006/0227463 A1 * | 10/2006 | Wright et al. ............. 360/244.2 |

* cited by examiner

How to distinguish Shear Mode Piezoelectric Micro-actuators

| Distinguishing Feature | Shear Mode | Trans. or Long. Modes |
|---|---|---|
| 1. Motion | shear | expand and contract |
| 2. Electrical properties | | |
|    a. electrode area | 2 entire surfaces | 2 small areas at beam ends |
|    b. bipolar operation | yes | no |
|    c. E-field orientation to polarization | perpendicular | parallel |
|    d. moderate V- depolarizes | no | yes |
| 3. Mechanical support | | |
|    a. bond along entire length on axis of motion: | yes | no |
|    b. unsupported areas help maximize displacement | no | yes |
|    c. tradeoff between displacement and mechanical integrity | no | yes |
| 4. Secondary axis displacement | no | yes, one axis expands while another contracts |
| 5. Mechanical integration properties | | |
|    a. ability to withstand shock | high | low |
|    b. vibration susceptibility | low | high |

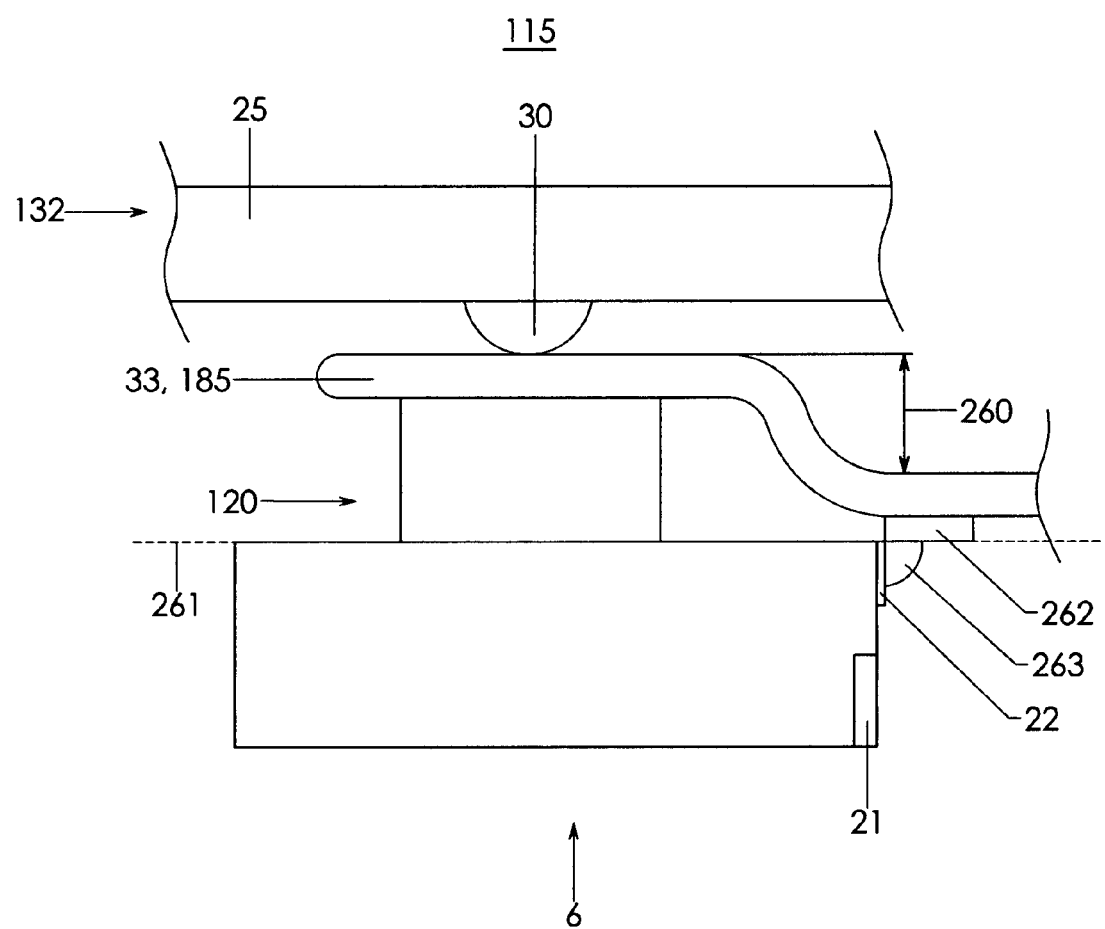

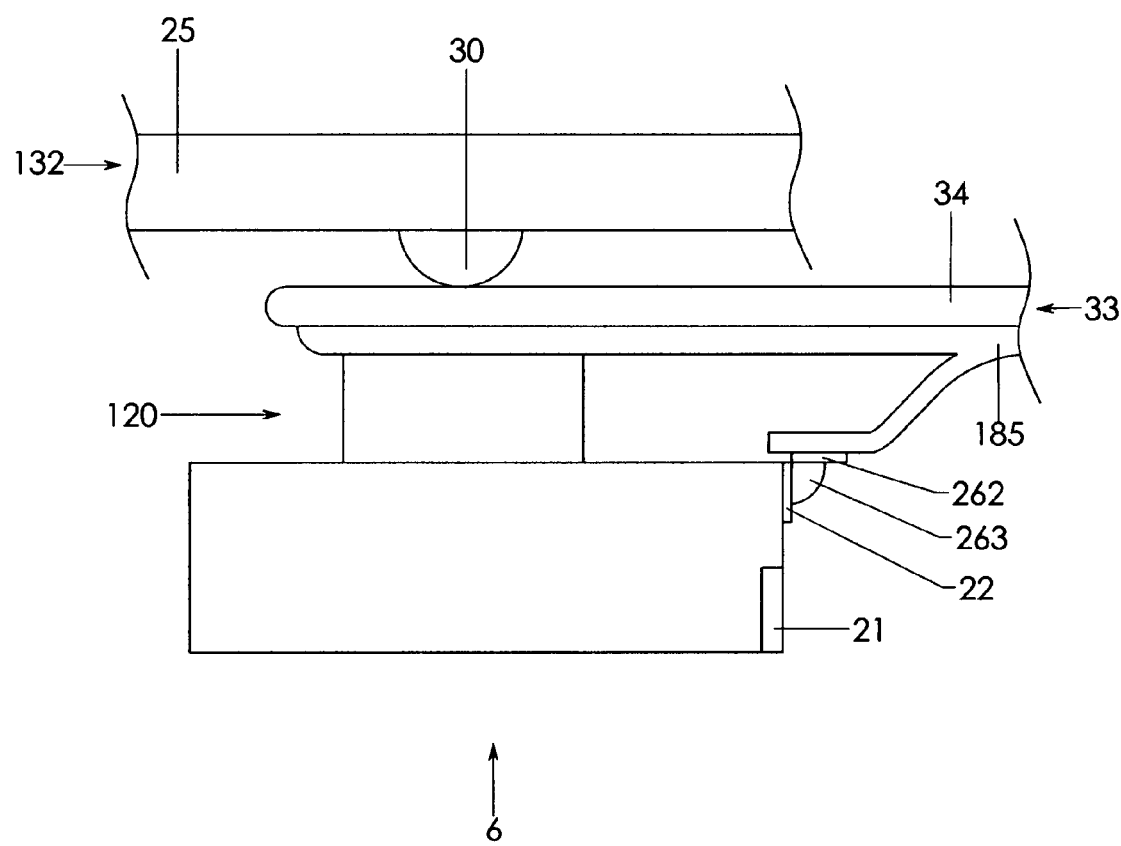

ROTATIONAL, SHEAR MODE, PIEZOELECTRIC MOTOR INTEGRATED INTO A COLLOCATED, ROTATIONAL, SHEAR MODE, PIEZOELECTRIC MICRO-ACTUATED SUSPENSION, HEAD OR HEAD/GIMBAL ASSEMBLY FOR IMPROVED TRACKING IN DISK DRIVES AND DISK DRIVE EQUIPMENT

FIELD OF THE INVENTION

The present invention relates to a motor and more specifically to data storage technology including a read/write head, a slider, a suspension, a head gimbal assembly, a read/write head positioning mechanism, an actuator, a micro-actuator and data storage devices such as a magnetic disk drive and an optical disk drive, and finally the equipment used to manufacture and test components of said disk drives, including but not limited to, disk certifiers, disk servo writers and dynamic electrical head testers.

BACKGROUND ART

Increasing storage capacity is a goal in the data storage industry. Data storage products such as magnetic disk drives and optical disk drives, store digital information on rotating disks using a read/write head. The information is typically recorded in concentric, circumferential tracks about the near-center of the disk. One method to increase data storage capacity is to increase track density, where track density is defined as the number of tracks per radial inch (TPI) or in the metric system, number of tracks per millimeter radius.

Increasing track density involves many factors, some of which are reducing the read/write head's track width, increasing the resolution and frequency response of drive's head positioning system and increasing the signal to noise ratio (SNR) of the recording system. This patent addresses existing head positioning limitations by proposing a novel type of motor that is integrated into a suspension, head and HGA.

While the discussion below is focused on magnetic disk drives, it should be noted that the present invention also applies to optical disk drives, linear tape drives and other applications that require servo-controlled micro-actuation. The present invention additionally applies to the equipment used in the manufacture of disk drives and disk drive components. Two such components are disks and heads. Some of the equipment is known in the industry as disk certifiers, dynamic head testers and disk servo writers. An improved micro-actuated HGA with higher positioning resolution and higher frequency response improves reading and writing for all the equipment. It is particularly valuable to the disk servo writer that originally writes and defines for the disk drive the track location and density because improved written tracks and servo patterns increase drive performance.

Disk drives use a servo-controlled actuator to position the head on a desired track. The actuator moves the head from one track to another in a process called seek. It also maintains the head's position on a desired track in a process called track following. Track following is required because recorded tracks are not perfectly circular. Errors in the circular shape are due to spindle run-out, vibration modes from the numerous mechanical components of the disk drive, windage, acoustic noise and many interactions thereof. Tracking errors can be separated into repeatable run-out (RRO) and non-repeatable run-out (NRRO) components. The position error signal (PES), which is the position feedback signal from the head to the servo controller, has both low frequency and high frequency components. The servo controller operates up to the highest frequency possible while maintaining closed loop stability.

Most drives use a voice coil motor (VCM) to actuate head positioning. As track density increases, VCM actuators have limitations in resolution and frequency response. To increase storage capacity and increase track density, dual-stage actuators are being developed. The dual stage actuators use a VCM for seeking and coarse track following and use a micro-actuator for fine track positioning.

The use of the word motor and micro-actuator appear throughout this document. "Motor7" is a generic means for generating motion. "Micro-actuator" is a specific type of motor that generates motion for fine track positioning in disk drive and disk drive equipment. An "actuator" is a specific type of motor that generates motion for seeking and coarse track following in disk drive and disk drive equipment.

The previous art has three classifications of micro-actuators used in disk drives: suspension level, head level and collocation.

A suspension level micro-actuator has one or more micro-actuators integrated into the suspension's load beam. This design provides large displacements at the recording element because the long load beam creates mechanical advantage. These actuators suffer from insufficient frequency response at the head due to the low stiffness over the long distance between the micro-actuator and the head.

Head level micro-actuators have the micro-actuator integrated within the head. This design has the smallest distance between the actuator and recording element and therefore has very little mechanical loss. These designs suffer because they tend to distort the air bearing surface of the slider. With a head to disk spacing of say 10 to 15 nanometers, a distortion to the air-bearing surface (ABS) of a few nanometers is critical.

Collocated micro-actuators are mounted to the suspension flexure tongue and the head. The distance between the micro-actuator and head is small. The present invention promotes the use and benefits of collocated micro-actuators. However, collocation alone is insufficient to make a robust micro-actuator for disk drives.

To achieve desired performance, the mechanical stiffness between the microactuator and head must be maintained, micro-actuation must occur without inducing undesired vibrations in the head gimbal assembly (HGA), the displacement at the recording element must be sufficiently large and the frequency response of the entire system must be adequately high. Furthermore, the design must be capable of manufacture in terms of volume and cost, the structure must be robust to withstand in-process handling and cleaning, and the micro-actuator should minimally shed particles during drive operation. Finally, the micro-actuator must be able to operate in environmental extremes such as temperature, humidity, shock and vibration.

The objective of this invention is to improve upon these stated performance traits.

Three prior art patents are of particular interest because they have features utilized by the present invention. Although all three patents use collocated micro-actuators, the present invention is uniquely different from the prior art.

U.S. Pat. No. 6,246,552 B1 with date Jun. 12, 2001 and assignee TDK Corporation discusses a micro-actuated read/write head for disk drives. Micro-actuation is implemented using a piezoelectric or electrostrictive material that "elongates and contracts" which "linearly, circularly or rotationally" displaces the head for fine track positioning. The patent explains that internal vibration and unintended changes in flying height are problems that can be addressed. Although the present invention uses slider rotation for micro-actuation, it differs from the TDK patent at least because TDK does not use a shear mode piezoelectric micro-actuator.

U.S. Pat. No. 6,704,158 B2 with date Mar. 9, 2004 and assignee Western Digital Corporation discusses a head gimbal assembly for disk drives that uses a shear mode piezoelectric motor to micro-position the head with a "pure or nearly pure lateral movement." Although the present invention uses a collocated, shear mode piezoelectric micro-actuator, it differs from the Western Digital patent at least because the present invention requires a rotational movement rather than a pure or nearly pure lateral movement.

U.S. Pat. No. 6,760,196 B1 with date Jul. 6, 2004 and assignee Western Digital discusses a micro-actuator with two offsetting hinges that rotates the slider. The patent states that the piezoelectric motor "expands" and "contracts" and references the TDK patent discussed above. This Western Digital patent does not use a shear mode piezoelectric micro-actuator and is therefore different from the present invention for at least that reason.

Unlike the three patents list above, this present invention is a rotational, shear mode, piezoelectric motor that is integrated into a collocated, rotational, shear mode piezoelectric microactuated suspension, head and HGA.

Rotating micro-actuators are now compared to transverse micro-actuators.

Transverse micro-actuators translate the head perpendicularly or laterally to the recorded track to achieve track following. The transverse micro-actuator exerts a force in one direction to the head and an equal and opposite force to the suspension. While the micro-actuator itself may be mechanically stiff and provide high frequency response, the suspension is not mechanically stiff on the transverse axis. Lack of stiffness reduces the frequency response of the system. The transverse micro-actuator pushes the entire mass of the head sideways yet has very little mass from which to push. Both mass and spring arguments reduce the frequency response of the transverse micro-actuator.

The rotating micro-actuator rotates the head about a rotational axis that is ideally located at the head's center of mass. In this ideal case, micro-actuating the head causes no net movement of the head mass along the transverse axis. Therefore, no mass-shifting disturbance is generated in the load beam and the low lateral stiffness of the suspension does not diminish the performance of the system. When the micro-actuator is activated, two equal torques are generated in the slider and flexure tongue. Because of the proximity and stiffness of these surfaces, high frequency response is achieved. While rotation about the exact center of mass of the head is improbable, it is understood that the closer the rotation axis is to the head's center of mass, the smaller a disturbance is created in the suspension.

Disk drive micro-actuators commonly use piezoelectric motors that utilize the transverse or longitudinal inverse piezoelectric effect. A control voltage applied to the micro-actuator causes the piezoelectric material to expand or contract creating a displacement. Usually in some form of beam shape, these piezoelectric motors have electrical and mechanical contact at the ends of the beam, allowing the middle section of the beam to freely expand and contract. The beam's ends are rigidly integrated with the rest of the micro-actuator system with conductive adhesive. Rigid integration is good for high frequency performance.

The longitudinal and transverse piezoelectric motors have several disadvantages when used as micro-actuators in disk drives. The middle section of the piezoelectric beam that is free to expand and contract is mechanically unsupported and therefore is less robust to shock and vibration. Mishandling or a large shock can fracture the brittle piezoelectric beam. Unsupported piezoelectric beams not only react to vibrations, they can also source and amplify vibrations. Another disadvantage arises when the desired axis expands and contracts, specifically, a secondary axis respectively contracts and expands. This secondary axis of actuation can lead to undesired displacement and vibration. These piezoelectric motors also have an undesirable property that moderate reverse voltages can depolarize the piezoelectric motor.

Micro-actuators that use shear mode piezoelectric motors have several advantages. Shear mode piezoelectric motors have highest displacement per volt of any piezoelectric configuration. Shear mode piezoelectric motors have a displacement that is independent of thickness, and therefore, can be thin and effective. Third, shear mode piezoelectric motors can be mechanically integrated into a micro-actuator system with far more stiffness and mechanical integrity than longitudinal and transverse piezoelectric motors. This feature is particularly important to the present invention.

Shear mode piezoelectric motors also avoid some of the disadvantages of the longitudinal and transverse mode piezoelectric motors. Shear mode piezoelectric motors allow bipolar operation, meaning they have equal displacements from applied positive and negative voltages. Shear mode piezoelectric motors avoid the reverse voltage depolarization property of the longitudinal and transverse piezoelectric motor types because shear mode piezoelectric motors operate with the electric field applied perpendicular to the polarization whereas the other types operate with the electric field applied parallel to the polarization.

The shear mode piezoelectric motor is oftentimes a thin, planar structure. To actuate, a voltage difference is applied to the top and bottom surfaces and the two surfaces move laterally (shear) with respect to one another. Because the entire area of the piezoelectric motor's top and bottom surfaces can be mechanically bonded into a microactuated assembly, the piezoelectric motor is stiffly integrated and highly supported along its entire length and width. Shear mode piezoelectric motors integrated into a microactuator can thus provide high frequency performance, minimal internal vibrations and improved robustness to external shock and vibration.

Prior art, discussed in the Fujitsu Scientific Journal December 2001 issue by author Shinji Koganezawa et al in a paper entitled "Development of a Shear Mode Piezoelectric Micro-actuator for Precise Head Positioning" explains how a shear mode piezoelectric motor is effectively integrated into a suspension level micro-actuator that increases microactuation frequency response and improves shock resistance.

FIG. 1 illustrates a disk drive 1 that has a base 2 to which a spindle motor 3 is attached. The spindle motor 3 rotates one or more disks 4 on which concentric circles of data are recorded one track 5 at a time by recording head 6. Head 6 is attached to a flexible suspension assembly 7 that is attached to a rigid E-block 8 that rotates about a pivot bearing 9. A voice coil motor 10 comprised of a voice coil rotor 11 attached to E-block 8 and a permanent magnet stator 12 attached to base 2 responds to a control voltage 13 that conducts through a HSA flexible circuit 14 from the circuit board 15 located beneath the base 2 (not visible) to position head 6 on a desired track 5.

FIG. 2 illustrates a head/gimbal assembly (HGA) 20. An HGA 20 is composed of a recording head 6 and suspension assembly 7. The head 6 is comprised of a read/write element 21 with head bond pads' 22 integrated on a ceramic slider 23 that has an air-bearing surface (ABS) 24. The suspension assembly 7 is comprised of a semi-rigid, typically stainless steel load beam 25, having a bend radius hinge 26, stiffening rails 27, an alignment hole 28, an alignment slot 29 and a half-sphere dimple 30 on which the head 6 will gimbal. Attached to the load beam 25 is a thick, stiff base plate 31 with a swage hole 32. Also attached to load beam 25, is a flexure assembly 33 comprised of a flexible stainless steel flexure 34 and flex circuit 35. The end of flexure assembly 33 located underneath the dimple 30 that attaches to head 6 is called the flexure tongue 36. Attached to flexure 34 is a flex circuit 35. Flex circuit 35 is composed of a top and bottom electrically non-conductive polyimide layer 41 with multiple, electrically conductive metal traces 42 sandwiched in between, that terminate at flexure tongue 36 with tongue bond pads 43 at one end, and at the other end, terminate near base plate 31 with base plate bond pads 44.

The load beam 25 and flexure 34 are typically manufactured from planar stainless steel sheets that are subsequently chemically etched to almost any two-dimensional (2D) design within the limitations of process tolerances. Typical etched features are holes, slots, beams and hinges. The present invention makes use of said 2D design features that can be routinely and precisely fabricated. The flat patterned stainless steel sheets are then formed into desired three-dimensional shapes.

The flex circuit 35 is generally made using thick and thin film technology. Almost any 2D shape can be created within the limitations of processing tolerances. It is common for the traces 42 of flex circuit 35 to bend around holes and slots, cross hinges, follow beams and flex around non-planar formed features. The present invention makes use of this ability.

FIG. 3A illustrates a prior art, passive longitudinal or transverse mode piezoelectric micro-actuator 50, which operates in the longitudinal or transverse inverse piezoelectric mode, that has a longitudinal or transverse mode piezoelectric beam 51, bonded with conductive adhesive 52 to a stationary support beam 53 on one side, and bonded with conductive adhesive 52 to a moving support beam 54 on the other side. The piezoelectric beam 51 has passive length 55 and passive thickness 56 when voltage 57 is applied across stationary support beam 53 and moving support beam 54 with a value of zero volts. Piezoelectric beam 51 has a polarization 58 that is parallel to the electric field 59 produced by applied voltage 57. Because the electric field 59 is zero, no elongation and contraction occurs.

FIG. 3B illustrates an active longitudinal or transverse mode piezoelectric microactuator 60 that is identical to said micro-actuator 50 except that voltage 57 now has a nonzero value. In the active state when a non-zero voltage 57 is applied, the polarization 58 and the electric field 59 are either parallel or anti-parallel and through the inverse piezoelectric effect, the piezoelectric beam 51 has either an elongated active length 62 and a decreased active thickness 63, or a shortened active length 62 and an increased active thickness 63 depending upon the polarity of voltage 57, as respectively compared to the passive length 55 and passive thickness 56.

There are several benefits of using longitudinal or transverse mode piezoelectric micro-actuator 60 in a disk drive 1 for micro-positioning head 6. The primary benefit is that active longitudinal or transverse mode piezoelectric micro-actuator 60 can micro-actuate moving support beam 54 by expanding and contracting freely over the length of unsupported beam 64 without sliding mechanical components that could generate undesired free particles and be a source of micro-contamination in disk drive 1. Also, piezoelectric beam 51 is bonded to and mechanically supported by stationary support beam 53 and moving support beam 54 with conductive adhesive 52 over adhesive length 65. Such mechanical integration by conductive adhesive 52 helps attain desired resolution and frequency response.

However several deficiencies arise when longitudinal or transverse mode piezoelectric micro-actuator 60 is used in a disk drive 1. The unsupported beam 64 is susceptible to deflection 66. Deflection 66 is caused by shock and vibration forces 67 external to the drive and by vibration sources internal to the drive such as the voice coil motor 10, the spindle motor 3 and said micro-actuator 60 itself. The piezoelectric beam 51 in deflection 66 can directly generate out of plane vibration modes. All vibrations get amplified or dampened by the various mechanical components of the disk drive 1 and a few high gain modes can limit the frequency response of the servo system. In general, it is desired that no out of plane vibrations are generated and that beam deflections are minimized.

Longitudinal or transverse mode piezoelectric micro-actuator 60 also has two limitations. The achievable displacement is less for negative voltages that than for positive voltages and therefore, said micro-actuator 60 cannot operate as a bipolar device at relatively high voltages. The negative voltage, and more appropriately the negative electric field strength, must be limited in magnitude to prevent polarization reduction or polarization reversal as determined by the piezoelectric material's electric field coercivity.

FIG. 4 illustrates a dual stage actuated disk drive 70 (prior art) that uses a suspension level micro-actuated HGA 71 as a secondary actuator. The spindle motor 3 rotates disk 4 on which track 5 is recorded by head 6. Head 6 is mechanically supported and positioned by a micro-actuated suspension 72, E-block 8, pivot bearing 9 and VCM 10. VCM 10 is the primary actuator that performs coarse positioning Fine track positioning is performed by micro-actuator 73. Micro-actuator 73 displaces head 6 along transverse axis 74. Transverse axis 74 is perpendicular to longitudinal axis 75, which is defined as being tangent to track 5 at read/write element 21 of head 6. Micro-actuator 73 works by expanding or contracting in push-pull fashion a pair of longitudinal or transverse mode piezoelectric beams 51 about hinge axis 76 causing a micro-actuator displacement 77 and a head displacement 78 along the transverse axis 74 of read/write element 21. Head 6 does not rotate about an internal axis, but rather, revolves a minute angle about hinge axis 76.

Mechanical advantage is the ratio of the head displacement 78 to the micro-actuator displacement 77. A suspension level micro-actuated HGA 71 has a large mechanical advantage (20× typical) due to the long distance of the load beam 25.

FIG. 5A illustrates in side view prior art from U.S. Pat. No. 6,760,196, of what the author of the present inventor defines as a "collocated, rotational, non-shear mode piezoelectric micro-actuator 80." A load beam 25 with dimple 30 is attached to a flexure assembly 33 that has two offset hinges 82 (not visible in side view) that are attached by adhesive pads 83 and 84 to a longitudinal or transverse mode piezoelectric beam 51. Piezoelectric beam 51 also attaches to head 6 by adhesive pad 86. The piezoelectric beam 51 expands or contracts two offset hinges 82 which impart a rotation 87 of head 6 about rotation axis 88 as determined by the two offset hinges 82 located within the flexure tongue 36.

The design is "collocated" because the two longitudinal or transverse mode piezoelectric beams 51 are attached to flexure assembly 33 at the gimbal tongue 36 and to head 6. The design is "rotational" because a rotation 87 is imparted to head 6 about rotation axis 88. The design is identified as "non-shear mode" because a transverse or longitudinal mode piezoelectric beam 51 does not operate in shear mode.

FIG. 5B illustrates a magnified view of FIG. 5A that reveals in exaggerated fashion how the longitudinal or transverse mode piezoelectric beam 51 induces mechanical deformation at a microscopic level when a non-zero voltage 57 is applied. Because the adhesive pads 83 and 84 and the two offset hinges 82 impede the expansion of the piezoelectric beam 51 over the adhesive length 65 of adhesive pads 83 and 84, the piezoelectric beam 51, with its opposite side free to expand, bends at its ends as shown. Stated another way, the elastic properties of the stainless steel hinges 82 that are in contact with the longitudinal or transverse mode piezoelectric beam 51 are incapable of matching the high expansion rate of longitudinal or transverse mode piezoelectric beam 51. As a result, the unbalanced stress from expansion bends both the stainless steel hinges 82 and the piezoelectric beam 51. Similarly, the adhesive pad 86 and head 6 impede the expansion of the piezoelectric beam 51 over the adhesive length 65 of adhesive pad 86. With one side having impeded expansion and the opposite side free to expand, piezoelectric beam 51 has unbalanced stress and bends in the middle as shown. These microscopic bends in the piezoelectric beam 51 promote out of plane vibration. The build up of stress not only distorts the piezoelectric beam 51, it also distorts head 6. While shape deformation is generally undesired, deformation of the air bearing surface (ABS) 24 of head 6 is least tolerated.

The size of the adhesive pads 83, 84 and 86 has practical impact on the displacement performance of longitudinal or transverse mode piezoelectric beam 51. Large adhesive areas restrict the expansion and contraction of piezoelectric beam 51 but provide more mechanical stiffness to dampen unwanted vibrations. Small adhesive areas promote the free expansion and contraction of piezoelectric beam 51, yet the unsupported regions are more susceptible to unwanted vibration. Thus the tradeoff between maximizing displacement and maximizing vibration dampening is clearly identified for longitudinal or transverse mode micro-actuators 73.

FIG. 5C illustrates the same collocated, rotational, non-shear mode piezoelectric micro-actuator 80 as in FIG. 5A but now a shock force 89 that can be 600 G or more, such as due to head 6 slapping disk 4 when a disk drive 1 is accidentally dropped onto a concrete floor, causes a shock wave to pass through head 6, then through adhesive pad 86 to longitudinal or transverse mode piezoelectric beam 51. The necessary discontinuity between zones with and without mechanical support concentrates stress that facilitates fracture 90 of longitudinal or transverse mode piezoelectric beam 51.

FIG. 6 illustrates a prior art shear mode piezoelectric motor 100, which is a component of the present invention, where the shear mode piezoelectric material 101, typically a lead zirconium titanate (PZT) or any other shear mode piezoelectric material that is commercially available, has a top surface positive electrode 102, a bottom surface negative electrode 103 and a polarization 58. When voltage 57 is applied to positive electrode 102 and negative electrode 103, an electric field 59 perpendicular to polarization 58 in the shear mode piezoelectric material 101 causes a shear mode displacement 107 of the top surface positive electrode 102 relative to the bottom surface negative electrode 103 along a single axis that is parallel to polarization 58. If the applied voltage 57 is negative, then shear mode displacement 107 is negative. If the shear mode piezoelectric motor 100 is composed of a shear mode piezoelectric stack 108 and the electric field strength is held constant, then the shear mode displacement 107 is proportional to the number of layers of shear mode piezoelectric material 101 comprising the shear mode piezoelectric stack 108.

FIG. 7 illustrates prior art (U.S. Pat. No. 6,704,158) with an end view of a collocated, transverse, shear mode piezoelectric micro-actuator 110, where a shear mode piezoelectric motor 100 is attached to the flexure assembly 33 at the flexure tongue 36 and to the head 6 by an unknown adhesive 111. Ignoring how electrical contact to the shear mode piezoelectric motor 100 is implemented, a control voltage 13 causes a shear mode displacement 107 that equally displaces head 6 and recording element 21 along the transverse axis 74 to perform fine track positioning on track 5 of disk 4.

This end view clearly shows that the shear mode piezoelectric motor 100 moves the head 6 on the transverse axis 74, which is in agreement with the prior art patent claim of "pure or nearly pure lateral movement" of the slider 23.

Prior art U.S. Pat. No. 6,704,158 explains how micro-actuators that are collocated have a servo bandwidth typically greater than 5 kHz whereas micro-actuators that are not collocated (such as the micro-actuated suspension 72) typically have a servo bandwidth of 1.5 to 3 kHz. Prior art U.S. Pat. No. 6,704,158 explains how shear mode piezoelectric motor 100 has less friction and creates less particle contamination than longitudinal and transverse piezoelectric beams 51. The present invention takes advantage of these benefits.

This prior art is what the author calls a collocated, transverse, shear mode piezoelectric micro-actuator 110. It is collocated because the shear mode piezoelectric motor 100 is attached to flexure assembly 33 at the flexure tongue 36 and to head 6. It is transverse because the shear mode piezoelectric motor 100 moves laterally to track 5 on the transverse axis 74. It uses a shear mode piezoelectric motor 100 because it is explicitly stated in U.S. Pat. No. 6,704,158.

The second disadvantage is that a collocated, transverse displacement design does not provide mechanical advantage. The collocated, transverse, shear mode piezoelectric micro-actuator 110 has a mechanical advantage factor equal to one.

Rotational displacement does not have the two disadvantages of lateral displacement discussed above with respect to FIG. 7. Rotational displacement avoids the issue of mass displacement by rotating the head about its near center of mass. Rotational displacement is not limited to a mechanical advantage of one as will be discussed later.

The present invention uses a shear mode piezoelectric motor as a micro-actuator as does the Fujitsu prior art identified above; however, instead of using a suspension level micro-actuator, the present invention uses a collocated micro-actuator. A thin adhesive layer stiffly integrates the head, motor and suspension assembly to form a collocated, rotational, shear mode piezoelectric micro-actuated HGA.

An object of this invention is to provide a rotational, shear mode, piezoelectric motor that can be integrated in a collocated, rotational, shear mode piezoelectric microactuated suspension, head and HGA that produces rotational displacement for fine track positioning in disk drives and disk drive equipment.

An object of the invention is to minimize the mass of the motor.

An object of this invention is to create a rotational, shear mode, piezoelectric motor that directly generates rotational displacement without the need for hinges.

An object of this invention is to maximize mechanical contact of a collocated, rotational, shear mode, piezoelectric micro-actuator to the head and flexure assembly to increases stiffness, dampen vibration, manage stress and contain particles.

An object of this invention is to use the elastic properties of materials to make solid state structures that generate rotational displacement from shear mode piezoelectric motors that have linear displacement.

SUMMARY OF THE INVENTION

A rotational, shear mode, piezoelectric motor is integrated into a collocated, rotational, shear mode, piezoelectric micro-actuated suspension, head or HGA for disk drives and disk drive equipment. When used in a disk drive system with dual stage actuation, the collocated, rotational, shear mode piezoelectric micro-actuated HGA provides fine track positioning and contributes toward higher track densities and higher data storage capacity. The present invention of a collocated, rotational, shear mode piezoelectric micro-actuated HGA has application in disk drives, disk certifiers, disk servo writers and dynamic head testers that require improved fine track positioning.

The rotational, shear mode, piezoelectric motor has several embodiments. Some embodiments change the shear mode piezoelectric motor type, size, shape, polarization, material composition, orientation, location, the number of stacked piezoelectric layers, the manufacturing process and the assembly process. Integrating said motor into a suspension, head or HGA product leads to more embodiments that modify the said motor itself such as the rotation displacement method, the electrical routing and the mechanical integration stiffness. Some embodiments modify the electrical and mechanical properties of the suspension or head to which the said motor is attached for the purpose of optimizing the frequency response, displacement, electrical routing and the assembly process.

BRIEF DESCRIPTION OF THE DRAWINGS

The advantages of the present invention and its purposes will be apparent from the following detailed description in conjunction with the appended drawings in which:

FIG. 18 illustrates two embodiment of how a micro-actuated suspension compensates for the thickness of a collocated, rotational, shear mode, piezoelectric micro-actuator.

DETAILED DESCRIPTION OF THE PREFERRED EMBODIMENTS

Figure 1:
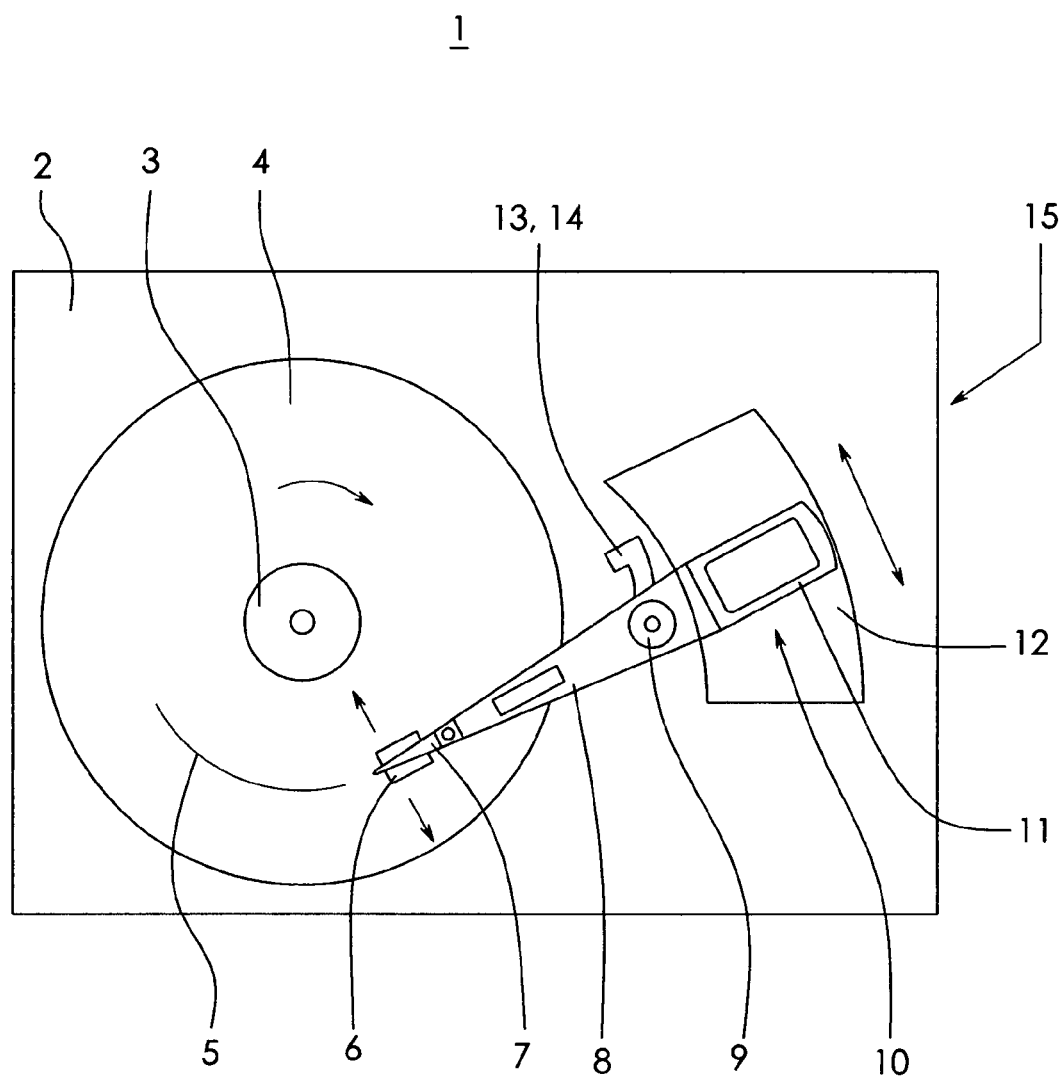
FIG. 1 illustrates the major components of a disk drive (prior art)
Figure 2:
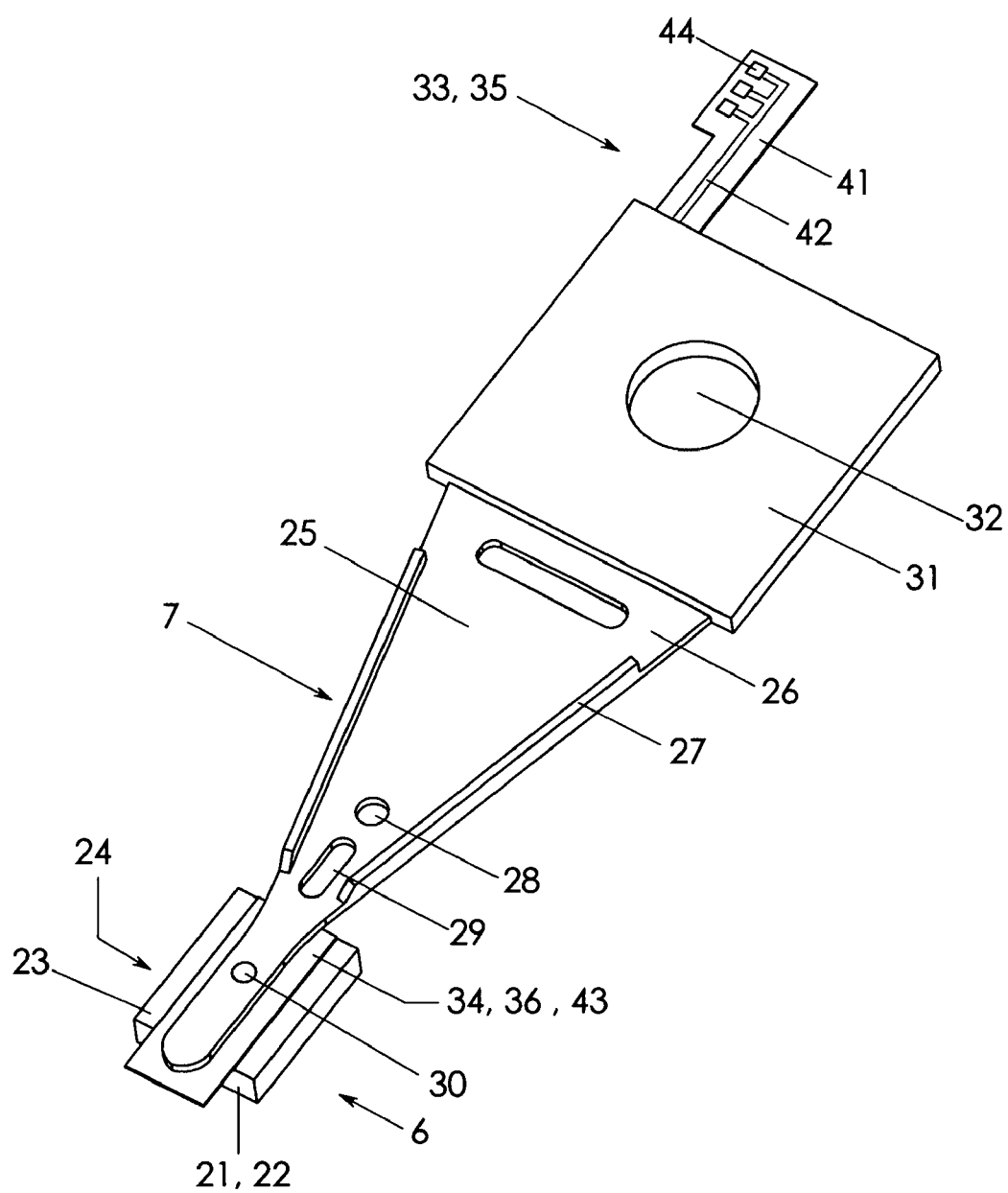
FIG. 2 illustrates the major components and features of an HGA (prior art)
Figure 3A:
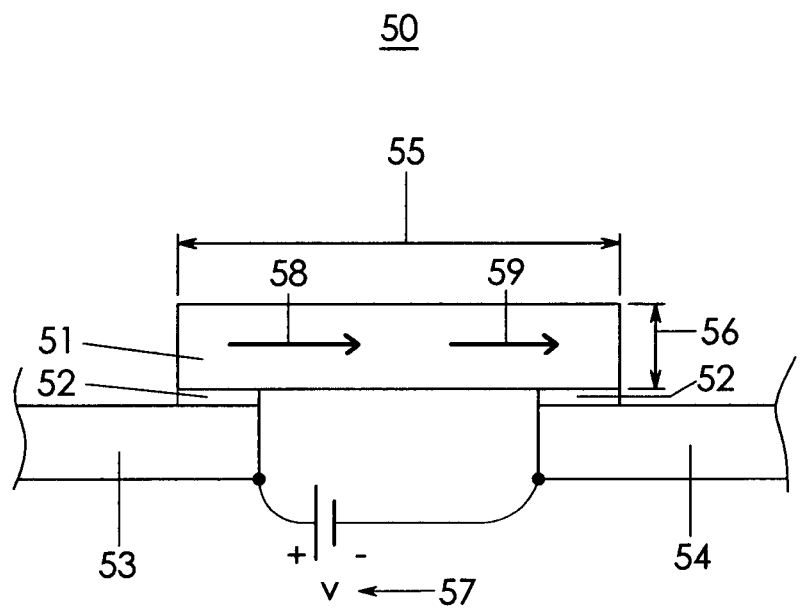
FIGS. 3A and 3B respectively illustrate a longitudinal or transverse piezoelectric microactuator in a passive and active state (prior art)
Figure 3B:
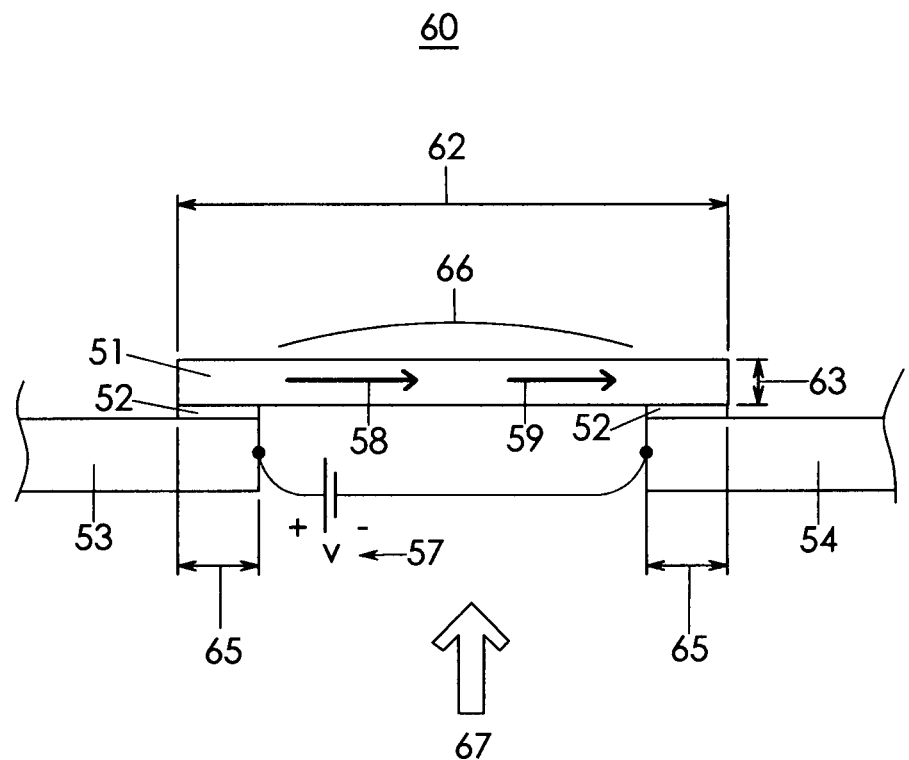
Figure 4:
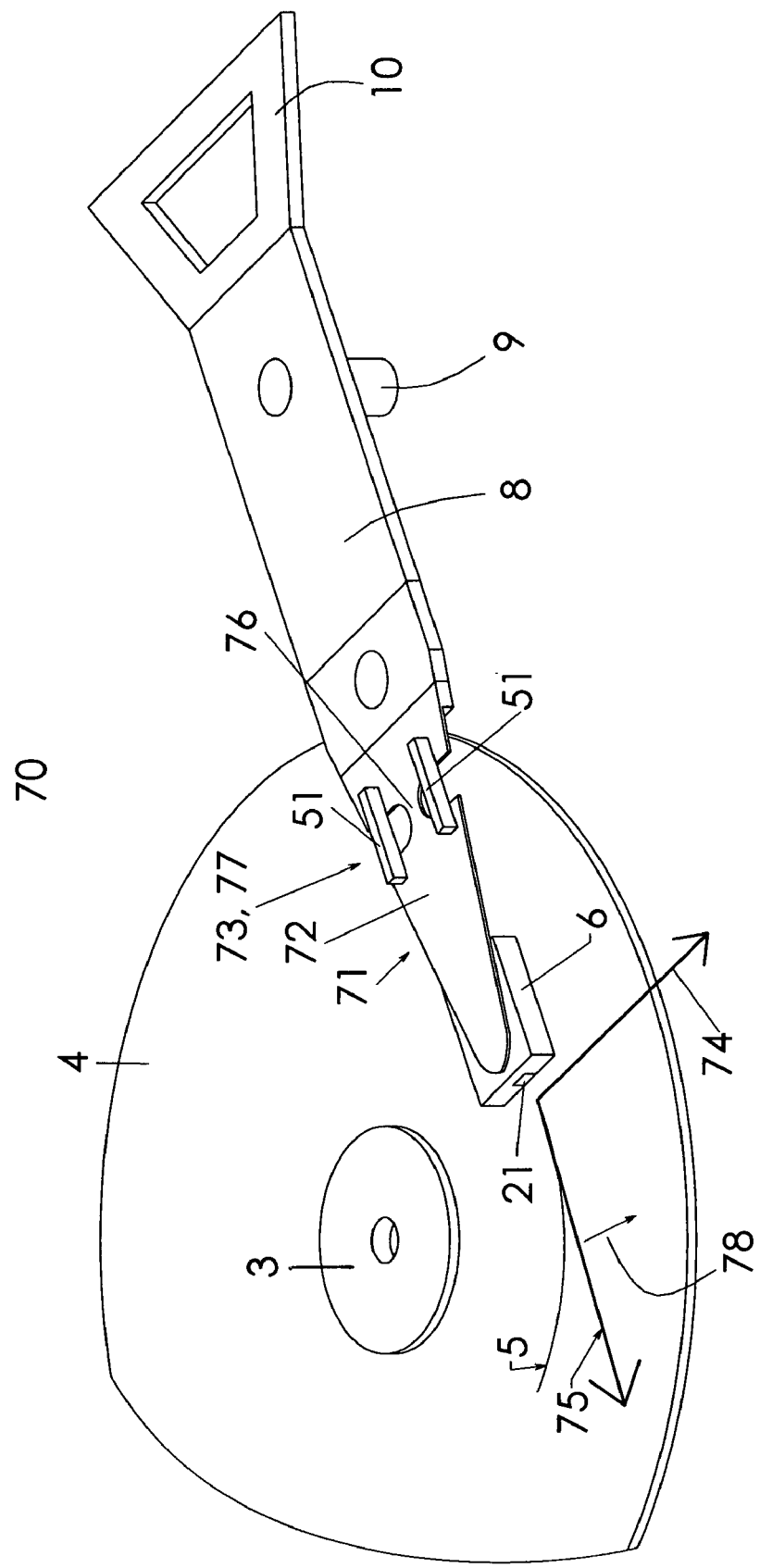
FIG. 4 illustrates a suspension level micro-actuated disk drive (prior art)
Figure 5:
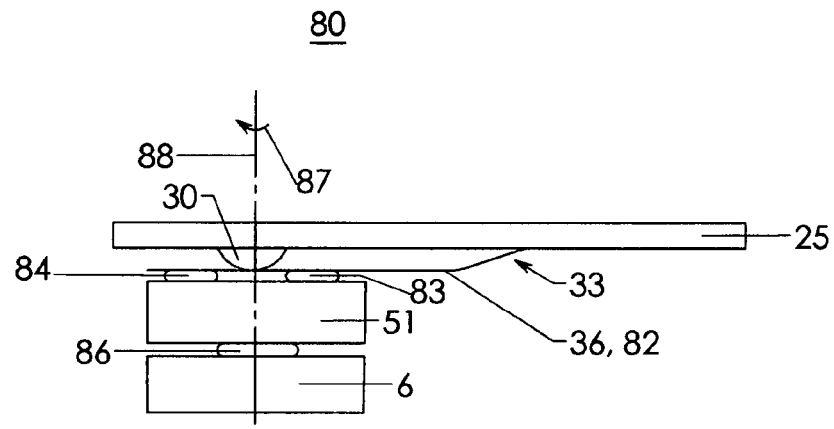
FIG. 5A illustrates prior art from U.S. Pat. No. 6,760,196 of a collocated, rotational, non-shear mode piezoelectric micro-actuator.
FIG. 5B illustrates the mechanical deformation induced by non-shear mode piezoelectric micro-actuators.
FIG. 5C illustrates how a non-shear mode piezoelectric micro-actuator is susceptible to shock-induced fracture.
Figure 5:
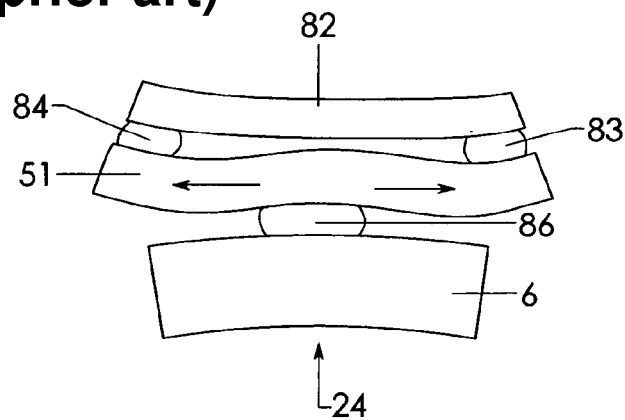
Figure 5:
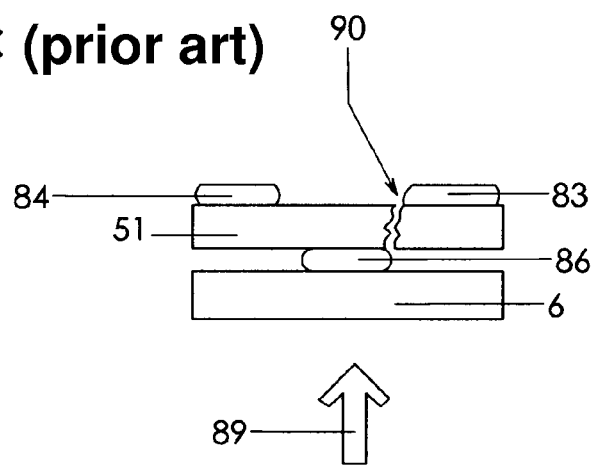
Figure 6:
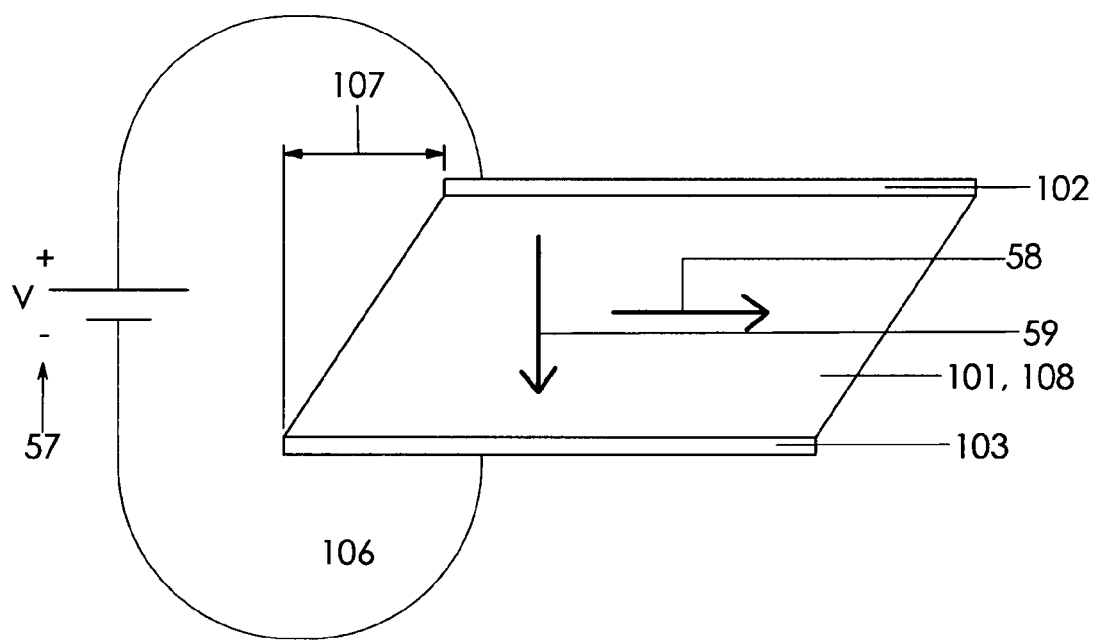
FIG. 6 illustrates a shear mode piezoelectric motor (prior art)

For the present invention, shear mode piezoelectric material 101 may come from sources other than commercially available bulk materials. Custom compositions and processing techniques may be needed to improve performance or miniaturize the shear mode piezoelectric motor 100. For instance, thin film deposition and etching techniques may be more appropriate for creating increasingly small motor patterns or increasingly thin stacked layers in high volume.

As used herein, the term "collocated" micro-actuator includes one that is bonded to the flexure assembly 33 at the flexure tongue 36, one that is bonded to the head 6, or one that is bonded to both the head 6 and the flexure assembly 33 at the gimbal tongue 36. Thus, a collocated micro-actuator does not strictly need to be located "between" head 6 and flexure assembly 33, as in the case where a micro-actuator may have some physical presence above the flexure 33 or beside head 6. Thus, as seen in FIG. 8, micro-actuator 120 is located at least partially above or below tongue 36 of flexure assembly 33 depending on the orientation of the suspension assembly 7, and/or is located at least partially above or below head 6 depending on the orientation of the suspension assembly 7.

Figure 7:
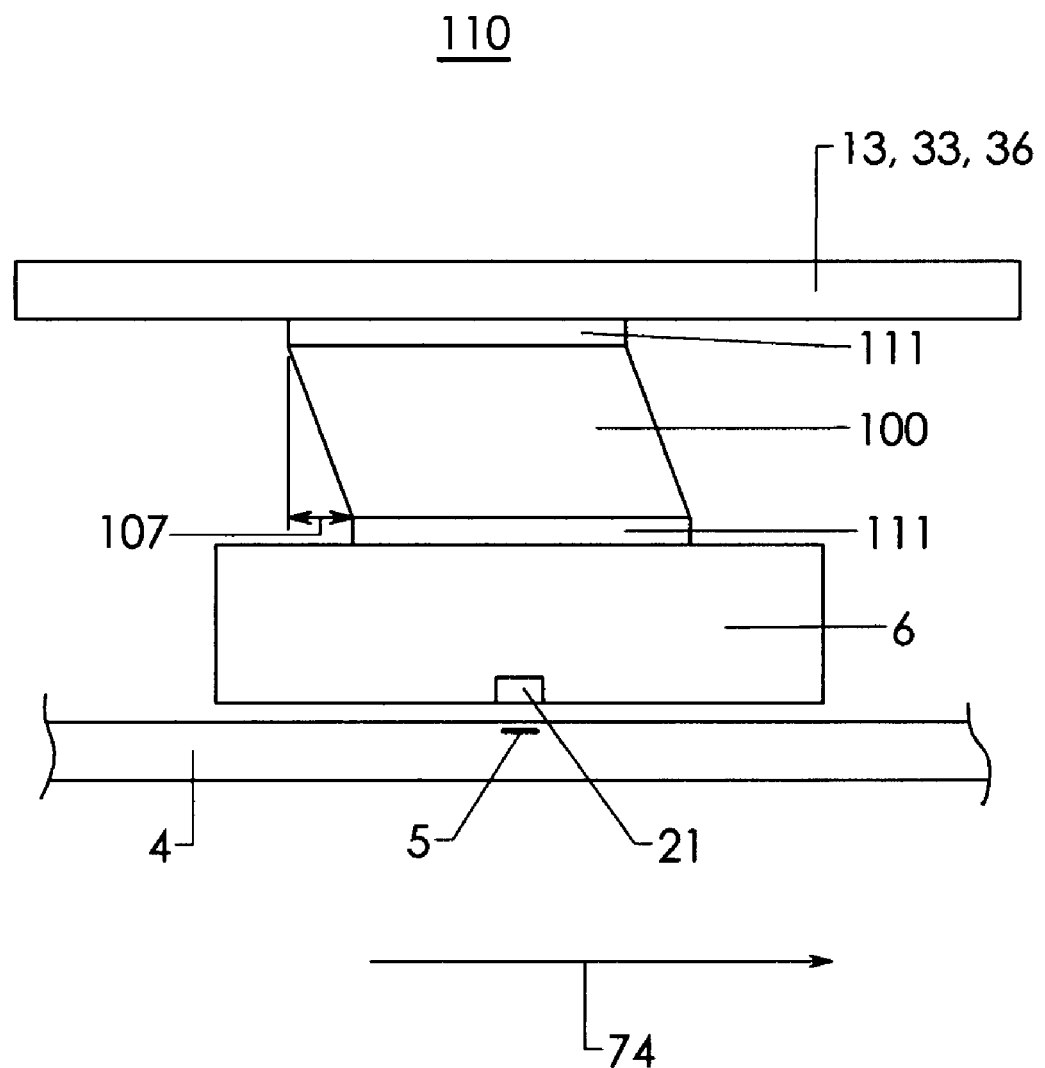
FIG. 7 illustrates a collocated, translational, shear mode piezoelectric micro-actuator (prior art)

Whereas this prior art uses transverse displacement, the present invention uses rotational displacement and is therefore different from the prior art collocated, transverse, shear mode piezoelectric micro-actuator such as micro-actuator 100 in FIG. 7. The advantages of rotational displacement and the disadvantages of transverse displacement will become apparent.

Pure or nearly pure lateral movement as illustrated in FIG. 7 has two shortcomings. First, lateral movement of head 6 involves displacing the mass of head 6 along the transverse axis 74. Transverse micro-actuation exerts a force in one direction to head 6 and an equal and opposite force to the suspension assembly. The suspension assembly is a type of spring designed to be low mass. When the collocated, transverse, shear mode piezoelectric microactuator 110 applies a transverse force which pushes-off from the suspension assembly to displace head 6, the low transverse spring rate and low mass of suspension assembly causes the suspension assembly to give way or comply, resulting in a reduced head displacement 78. The suspension assembly is a spring that stores the energy from the displaced mass of head 6. The loaded spring subsequently unloads the stored energy in a vibration spectrum that is colored by its own vibration modes.

Figure 8:
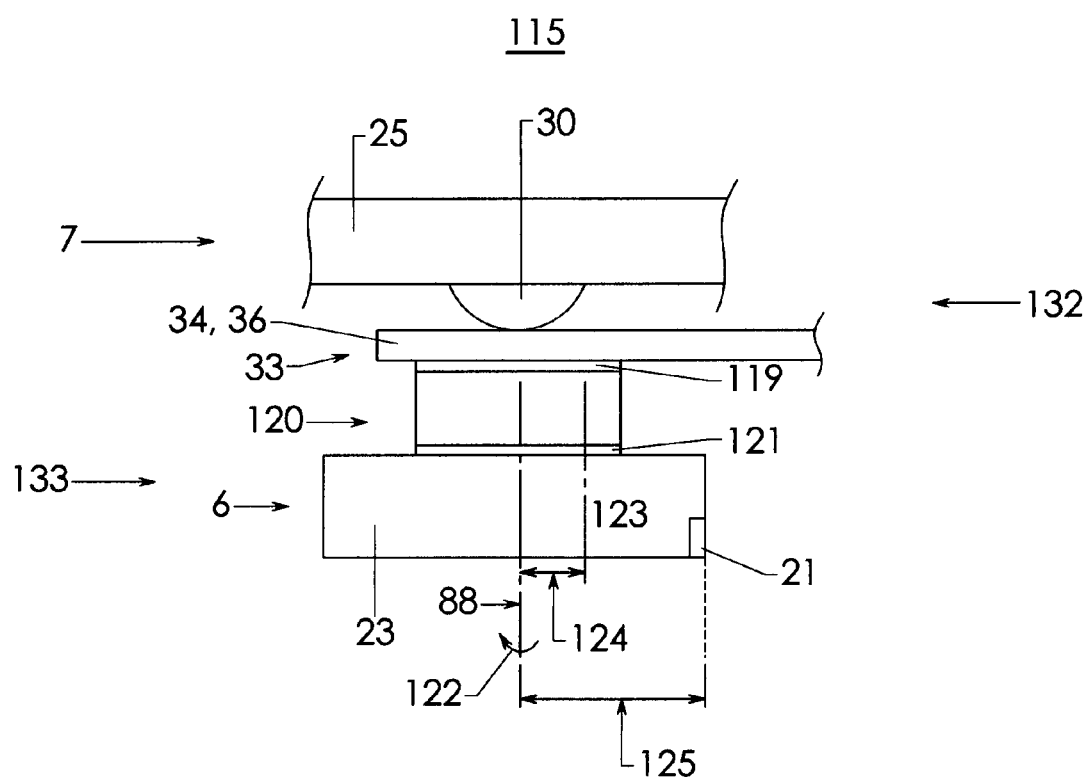
FIG. 8A illustrates the present invention of a collocated, rotational, shear mode piezoelectric micro-actuated HGA.
FIG. 8B is a table that distinguishes shear mode piezoelectric micro-actuators from longitudinal and transverse piezoelectric micro-actuators.

FIG. 8 illustrates the present invention by showing the side view of a collocated, rotational, shear mode, piezoelectric micro-actuated HGA 115. A portion of suspension assembly 7 is shown with load beam 25 that has a dimple 30 onto which flexure 34 of flexure assembly 33 mechanically gimbals. Bonded by flexure bonding material 119 to flexure assembly 33 at the flexure tongue 36 is a collocated, rotational, shear mode, piezoelectric micro-actuator 120, which is bonded by slider bonding material 121 to slider 23, a component of head 6. Collocated, rotational, shear mode, piezoelectric microactuator 120 generates rotational displacement 122 about rotation axis 88 at an effective micro-actuator radius of rotation 124 when voltage 57 is applied, causing read/write element 21 of head 6 to rotate about the same rotation axis 88 at a read/write element radius of rotation 125. The mechanical advantage is the ratio of the read/write element radius of rotation 125 to the effective micro-actuator radius of rotation 124. When integrated into disk drive 1 or disk drive equipment that generates a control voltage 13 that acts as voltage 57, collocated, rotational, shear mode, piezoelectric micro-actuated HGA 115 performs fine track positioning.

The other two forms of the present invention are visible in FIG. 8. A collocated, rotational, shear mode, piezoelectric micro-actuated suspension 132 is shown with attached head 6. A collocated, rotational, shear mode, piezoelectric microactuated head 133 is shown with an attached suspension assembly 7. In review, the present invention has four forms, namely said HGA 115, said micro-actuator 120, said suspension 132 and said head 133.

Special attributes can be recognized in this drawing. The collocated, rotational, shear mode piezoelectric micro-actuator 120 is collocated because it is bonded to the flexure assembly 33 at the flexure tongue 36 and to the head 6.

Another attribute recognized in FIG. 8 is that the microactuator 120 has rotational displacement 122 about rotation axis 88. Rotation provides two main benefits: increased head displacement 78 due to the stated mechanical advantage and increased frequency response due to high rotational stiffness and reduced (or eliminated) mass displacement of head 6 along the transverse axis 74.

Collocated, rotational, shear mode, piezoelectric microactuator 120 ideally generates rotation by applying equal and opposite torques to the slider 23 and flexure tongue 36, both of which have a close proximity and a sufficiently high, mechanically stiff attachment to said micro-actuator 120 to meet the desired high frequency response. Rotating head 6 about its center of mass achieves head displacement 78 for fine track positioning without translating the mass of head 6 on transverse axis 74, thus avoiding the stated problems associated with the low mass and low transverse spring rate of the suspension assembly 7. While rotation about the exact center of mass of the slider is not always strictly achievable, it is understood that the closer the rotation axis is to the head's center of mass, the smaller a disturbance is created in the suspension assembly 7 and elsewhere.

While ideally located at the center of mass of head 6, rotation axis 88 can be purposely located at some other position to improve other performance variables at the expense of not rotating about the center of mass. For instance, moving the position of rotation axis 88 further away from read/write element 21 increases mechanical advantage.

With the "collocated" and "rotational" benefits already stated, the "shear mode" portion of collocated, rotational, shear mode, piezoelectric micro-actuator 120 is now discussed because the "shear mode" aspect provides several advantages. Collocated, rotational, shear mode, piezoelectric micro-actuator 120 is comprised of one or more shear mode piezoelectric motors 100. Shear mode has the highest piezoelectric strain constant of any piezoelectric mode. It performs well in bipolar operation and does not exhibit depolarization at moderate levels of negative voltage, as do other piezoelectric modes, because the electric field 59 is perpendicular to polarization 58. Shear mode has a displacement that is independent of thickness, and therefore, can be thin and effective. This is important because it is advantageous to minimize the distance between the flexure tongue 36 and slider 23.

The top and bottom surfaces of collocated, rotational, shear mode, piezoelectric micro-actuator 120 move laterally (shear) with respect to one another with all of the displacement occurring within the shear mode piezoelectric material 101. Thus collocated, rotational, shear mode, piezoelectric micro-actuator 120 is solid state and has no mechanically sliding surfaces to cause micro-contamination.

The entire available areas of the top and bottom surfaces of collocated, rotational, shear mode, piezoelectric micro-actuator 120 are tightly bonded to adjacent surfaces such as a stainless steel supported flexure assembly 33, a ceramic slider 23 or some other component comprising collocated, rotational, shear mode, piezoelectric micro-actuator 120. These adjacent surfaces provide a stiff mechanical structure for achieving high resolution and high frequency response, mechanical dampening to reduce vibration, mechanical support to manage loads and mechanical containment to minimize particulate generation. Note that shear mode piezoelectric material 101 is brittle compared to stainless steel and ceramic materials and that mechanical integration over its entire top and bottom surfaces improves its mechanical robustness. For example, when a shock force 89 occurs, the adjacent layers of stainless steel and ceramic materials bonded over the entire surface of collocated, rotational, shear mode, piezoelectric micro-actuator 120 help prevent fracture 90.

Piezoelectric motors are commercially available that operate in longitudinal, transverse and shear modes. To separate the present invention from prior art and to protect the present invention from infringement, FIG. 8B lists distinguishing features that differentiate shear mode from transverse and longitudinal modes. Note that while transverse and longitudinal modes are more difficult to differentiate, the shear mode is easy to differentiate from the transverse and longitudinal modes.

Collocated, rotational, shear mode, piezoelectric micro-actuator 120 is an assembly that has several embodiments that facilitate rotation, mechanical integration and electrical integration. Several embodiments will be discussed including three types of collocated, rotational, shear mode piezoelectric micro-actuators 120, three methods of electrical connection and several methods of mechanical integration. It will become clear that many embodiments are possible, while still sharing the traits of collocated, rotational, shear mode, piezoelectric micro-actuator 120.

One single embodiment cannot be the preferred embodiment because performance optimization is multi-dimensional and has multiple solutions.

Figure 9:
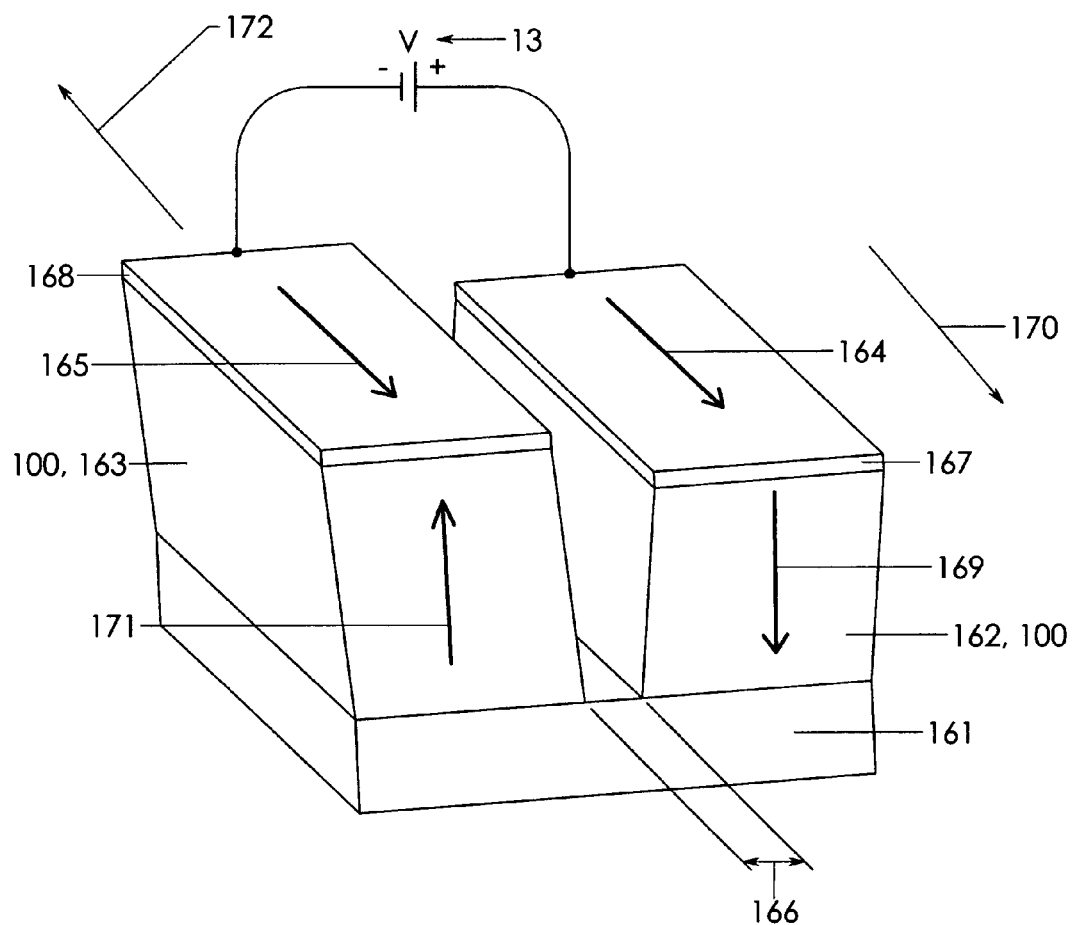
FIG. 9 illustrates a push-pull shear mode piezoelectric micro-actuator.

FIG. 9 illustrates a push-pull, shear mode piezoelectric micro-actuator 160, which is one embodiment of collocated, rotational, shear mode, piezoelectric micro-actuator 120, comprised of an electrically conductive bottom support 161, to which is bonded two shear mode piezoelectric motors 100 that are separately identified as shear mode piezoelectric motors 162 and 163 with respective linear polarization directions 164 and 165 that are in the same direction. Shear mode piezoelectric motors 162 and 163 are parallel to each other at a motor spacing distance 166. When control voltage 13 is applied to the top surface positive electrode 167 of motor 162 and the other top surface negative electrode 168 of motor 163, a downward pointing electric field 169 is created in motor 162 causing displacement 170 which is parallel to polarization direction 164, and an upward pointing electric field 171 is created in motor 163 causing opposite displacement 172 which is antiparallel to polarization direction 165, resulting in push-pull, shear mode piezoelectric micro-actuator 160.

The fabrication of push-pull, shear mode piezoelectric micro-actuator 160 can be done with present grinding, lapping, etching and bonding equipment commonly used in the disk drive industry. One batch process sequence is to bond a shear mode piezoelectric wafer to a substrate with a conductive top surface, then precision grind a spacing distance 166 between motors 162 and 163 and finally define the length and width of motors 162 and 163 using process steps similar to those used in high volume slider fabrication or ferrite core technology. The resulting diced elements are push/pull, shear mode, piezoelectric micro-actuators 160. The assembly process for this single piece assembly can be as simple as requiring accurate positioning and adhesive attachment. For example, a pick and place robot can be used with an adhesive micro-dispenser to attach the single piece, push/pull, shear mode, piezoelectric micro-actuator 160 to flexure assembly 33 to make a collocated, rotational, shear mode, piezoelectric micro-actuated suspension 132.

Several embodiments of push-pull, shear mode piezoelectric micro-actuator 160 will later be discussed which define three electrical configurations and various mechanical configurations.

Figure 10:
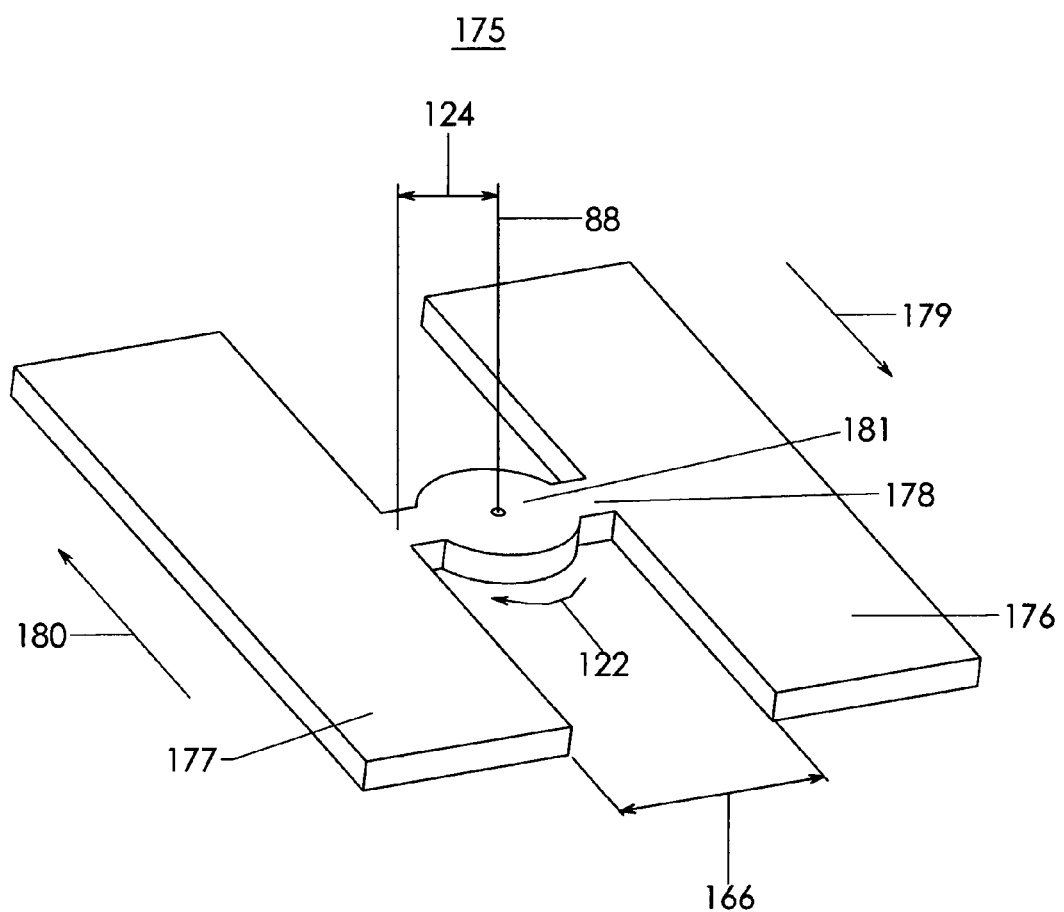
FIG. 10 illustrates a mechanical coupling plate that converts linear displacement from a push-pull shear mode piezoelectric micro-actuator into rotational displacement.

FIG. 10 illustrates one embodiment of a mechanical coupling plate 175 that converts two opposing linear shear mode displacements 107 into a rotational displacement 122, as when mechanical coupling plate 175 is bonded to the top of push-pull, shear mode piezoelectric micro-actuator 160.

Mechanical coupling plate 175 may be composed of a single material such as stainless steel, yet it could be composed of one or more other materials depending upon the integration requirements. For example, if mechanical and electrical integration is required, then mechanical coupling plate 175 may be comprised of stainless steel and the materials comprising flex circuit 35.

Having tab 176 and tab 177 that match the shape of shear mode piezoelectric motors 162 and 163 and the motor spacing distance 166 of push-pull, shear mode piezoelectric micro-actuator 160, this mechanical coupling plate 175 has cross-member 178 which undergoes rotational displacement 122 about rotation axis 88 when motor 162 displaces tab 176 in one displacement direction 179 and motor 163 displaces tab 177 in the opposite displacement direction 180. The effective micro-actuator radius 124 is approximately one half the motor spacing distance 166. Note that decreasing the effective micro-actuator radius 124 increases the mechanical advantage. Circular center region 181 of cross member 178 is a bonding surface onto which rotational displacement 122 is delivered to either the head 6 or the flexure assembly 33 at the flexure tongue 36.

Cross-member 178 acts as a solid-state hinge. As the rotation increases, stress increases in cross-member 178.

This particular design of mechanical coupling plate 175 is presented because it is easy to understand and clearly illustrates how two opposing linear shear mode displacements 107 can be converted into rotational displacement 122, using what essentially is solid-state hinge technology. Other designs that convert linear shear mode displacement 107 into rotational displacement 122 will be discussed that are less intuitive because they make use of the elastic properties of materials, which is better understood through finite element modeling.

The preferred embodiments of mechanical coupling plate 175 is to have its 2D shape etched into stainless steel flexure 34. Having the action of the mechanical coupling plate 175 incorporated into flexure 34 voids the need for a separate mechanical coupling plate 175 that converts linear shear mode displacement 107 into rotational displacement 122. Such integration reduces part count and mass, which in turn reduces cost and increases performance.

Mechanical coupling plate 175 can be used for purposes other than converting linear displacement 107 into rotational displacement 122. The mechanical coupling plate can be used as a flat surface onto which one or more shear mode piezoelectric motors 100 are bonded forming a single piece structure that is convenient for assembly. The mechanical coupling plate 100 may have a patterned conductive layer that electrically connects one or more shear mode piezoelectric motor 100 in series or in parallel. For example, mechanical coupling plate 175 can be used as an electrical conductor and a mechanical support as in support 161.

Figure 11:
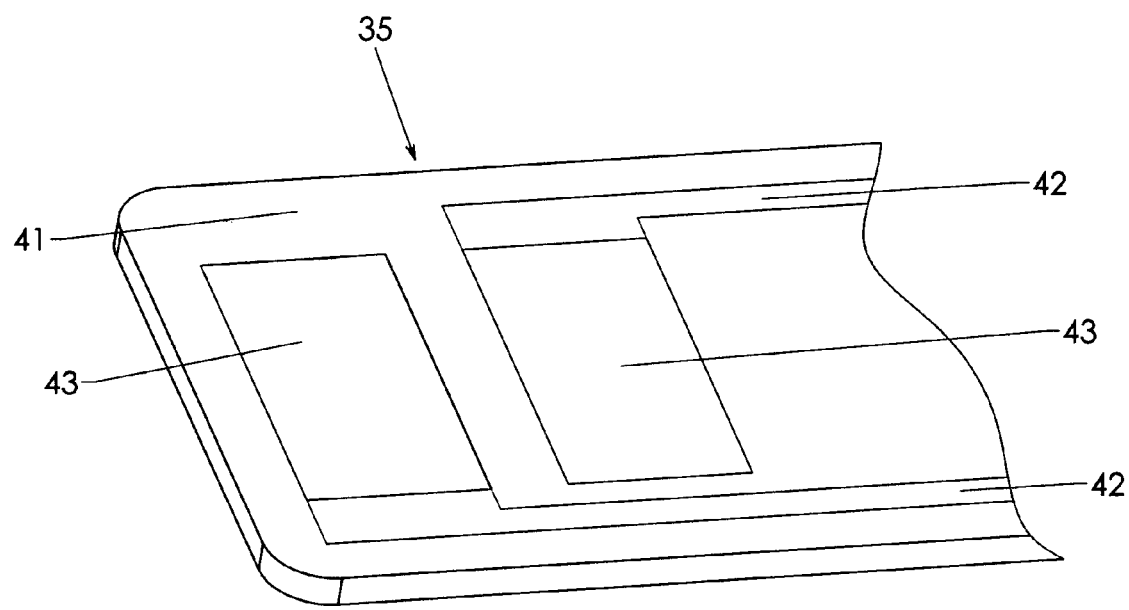
FIG. 11 illustrates a micro-actuator flex circuit.

FIG. 11 illustrates, in an inverted isometric view, one design of micro-actuator flex circuit 185 that mechanically and electrically connects to push-pull, shear mode piezoelectric micro-actuator 160. Micro-actuator flex circuit 185 is a flex circuit 35 modified with two extra electrical traces 42 for conducting control voltage 13 to two tongue bond pads 43 that have a geometry which matches the geometry of top surface positive electrode 167 of motor 162 and top surface negative electrode 168 of motor 163 of push-pull, shear mode piezoelectric micro-actuator 160.

It is noted that using ordinary skills in the industry, the geometry of the tongue bond pads 43, electrical traces 42 and flex circuit 35 can be readily modified into any 2D design to accommodate different motor and electrical connection configurations.

As stated earlier, flex circuit 35, including micro-actuator flex circuit 185, can be fabricated into almost any 2D shape and flexure 34 can be etched into almost any 2D shape. Such freedom to specify the 2D shape helps with the electrical and mechanical integration of any embodiment of collocated, rotational, shear mode, piezoelectric microactuator 120. Using push-pull, shear mode piezoelectric micro-actuator 160 as an example, a flexure assembly 33 can be designed to match the geometry of shear mode piezoelectric motors 162 and 163. The position and dimensions of shear mode piezoelectric motors 162 and 163 are used to design the tongue bond pads 43 of micro-actuator flex circuit 185 and the hinged tabs 176 and 177 of mechanical coupling plate 175 which are etched in flexure 34. Other embodiments of collocated, rotational, shear mode, piezoelectric micro-actuator 120 have one or more shear mode piezoelectric motors 100. It is understood that the 2D geometrical shape of flexure 34 and micro-actuator flex circuit 185 are designed to match the shape, location and number of shear mode piezoelectric motors 100 comprising collocated, rotational, shear mode, piezoelectric micro-actuator 120.

Figure 12A:
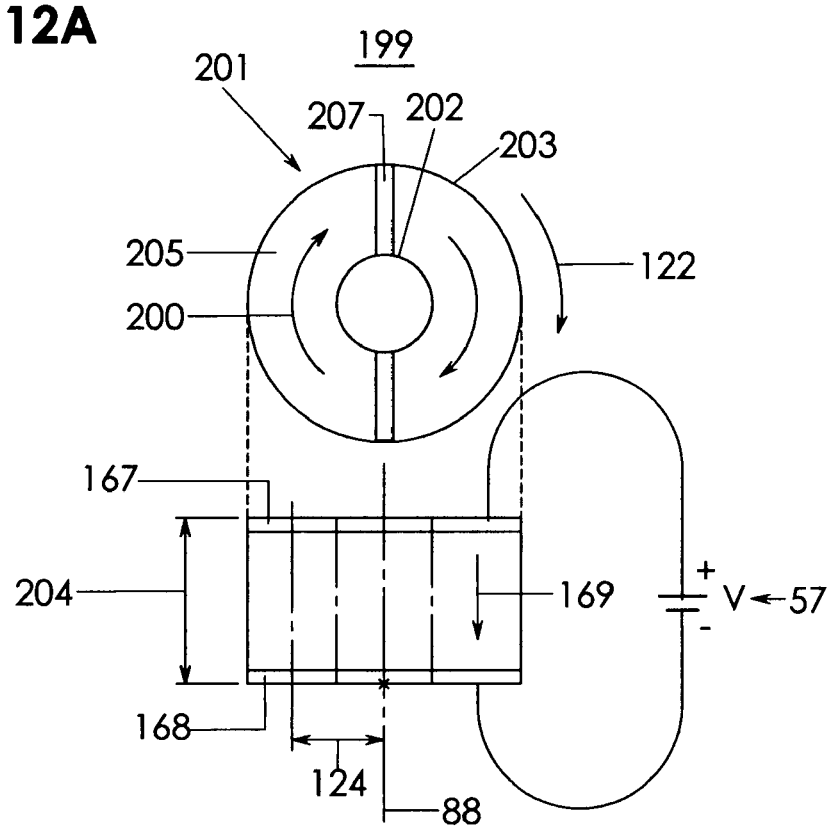
FIG. 12A illustrates a rotational, shear mode, piezoelectric motor.

FIG. 12A illustrates rotational, shear mode, piezoelectric motor 199 that uses circumferential polarization 200 to directly achieve rotational displacement 122. Its application extends beyond micro-actuation in disk drives to any device that needs a motor for fine rotational positioning. Circumferential polarization 200 is a new type of polarization 58 in shear mode piezoelectric material 101 whose direction arcs in circular fashion, as opposed to the most common type of polarization 58 that has a single direction that is often expressed as linear, single axis or uniaxial or a less common polarization 58 that has radial orientation. Note that circumferential polarization does not have to complete a circle.

Rotational, shear mode, piezoelectric motor 199 is comprised of disk 201 with inner radius 202 and outer radius 203 and a thickness 204. The disk 201 is constructed from half-disk 205 made of shear mode piezoelectric material 101 with circumferential polarization 200 that is bonded with non-conductive adhesive 207 to another identical half disk 205. Together the two half-disks 205 form a complete disk 201 with piecewise circumferential polarization 200 that completes a circle. The top surface of disk 201 has a deposited positive electrode 167 and the bottom surface of disk 201 has a deposited negative electrode 168. When voltage 57 is applied to positive electrode 167 and to negative electrode 168, a uniform downward pointing electric field 169 is generated throughout disk 201. Through the shear mode inverse piezoelectric electric effect, the downward pointing electric field 169 interacts with circumferential polarization 200 causing rotational displacement 122 about rotation axis 88 at an effective micro-actuator radius of rotation 124.

Rotational, shear mode, piezoelectric motor 199 does not require mechanical coupling plate 175 to convert linear displacement 107 into rotational displacement 122. The top surface of disk 201 rotates relative to the bottom surface of disk 201 by means of the inverse piezoelectric effect as controlled by the voltage 57.

Rotational, shear mode, piezoelectric motor 199 has internal mechanical coupling that requires the rotational displacement 122 to increase as a function of radius and therefore the shear mode displacement 107 throughout disk 102 is nonuniform. The nonuniform portion of rotational displacement 122 due to mechanical coupling about rotation axis 88 is called differential displacement 208. If disk 201 has an inner radius 202 and outer radius 203 that are nearly the same, then the effective micro-actuator radius of rotation 124 is the average of the inner radius 202 and outer radius 203 and no appreciable stress occurs due to the differential displacement 208 when non-zero voltage 57 is applied. As the ratio of the outer radius 203 to the inner radius 202 increases, so increases the amount of mechanical stress in disk 201 due to differential displacement 208 when nonzero voltage 57 is applied. At some large ratio, it is possible that the shear mode piezoelectric material 101 will mechanically fail. However, when the positive electrode 167 and negative electrode 168 are attached with conductive flexure bonding material 120 to flexure assembly 33 or to other structures, the shear mode piezoelectric material 101 will be mechanically supported and strengthened. Integration improves the mechanical integrity of the disk 201.

It should be noted that shear mode piezoelectric material 101 has a self-correcting feature that balances stress and displacement though the piezoelectric effect. Shear mode piezoelectric material 101 creates an electric charge that opposes the electric field strength from voltage 57 in regions with compressive stress through the piezoelectric effect thereby reducing displacement in proportion to the amount of compressive stress. Referenced to the outer radius 203, compressive stress increases with decreasing radius. Thus the piezoelectric effect decreases the displacement most where the compressive stress is highest, which is at the inner radius 202. Automatically arriving at its own equilibrium between levels of compressive stress and displacement, the inverse piezo electric effect and the piezoelectric effect have a net result that causes displacement to increase with increasing radius.

Rotational, shear mode, piezoelectric motor 199 may be comprised of a shear mode piezoelectric stack 108 with circumferential polarization 200 to increase the rotational displacement 122.

If performance needs to be enhanced by better aligning the circumferential polarization 200 closer to a particular crystal axis, such as the 4 11>axis in single crystal, shear mode piezoelectric material 101, then one solution is to have each half-disk 205 be composed of several pie-shaped shear mode piezoelectric material pieces having optimized crystal axis orientation that are then bonded together.

Figure 12B:
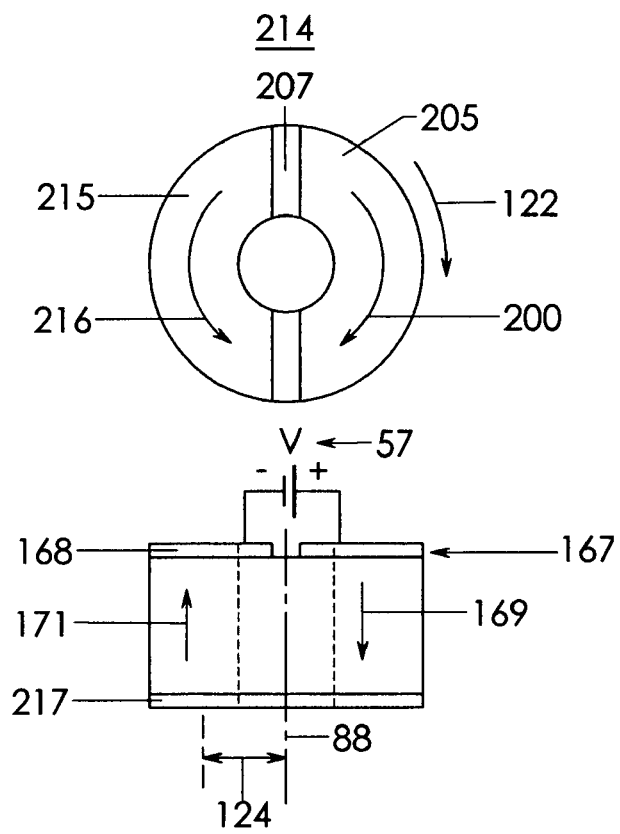
FIG. 12B illustrates a single sided, rotational, shear mode, piezoelectric motor.

FIG. 12B illustrates an alternate embodiment of a rotational, shear mode, piezoelectric motor 199 that has both the positive electrode 167 and the negative electrode 168 on the same surface. The electrical connection to the outside world is "single sided." The single sided, rotational, shear mode, piezoelectric motor 214 is composed of a half disk 205, with circumferential polarization 200 and a top surface, deposited positive electrode 167, which is bonded with non-conductive adhesive 207 to half disk 215, having a reverse circumferential polarization 216 that opposes circumferential polarization 200 and a top surface deposited negative electrode 168, creating a complete disk 201. This complete disk 201 has a deposited, bottom surface electrode 217 that electrically joins half disk 205 and half disk 215, thereby completing the electrical circuit for a single sided, rotational, shear mode, piezoelectric motor 214.

When a voltage 57 is applied to positive electrode 167 and negative electrode 168, a uniform downward pointing electric field 169 is generated through half-disk 205 and an upward pointing electric field 171 is generated through half-disk 215. Through the shear mode inverse piezoelectric effect, the downward pointing electric field 169 and upward pointing electric field 171 in shear mode piezoelectric material 101 respectively interact with the circumferential polarization 200 and reverse circumferential polarization 216 causing rotational displacement 122 about rotation axis 88 at an effective micro-actuator radius of rotation 124.

Rotational, shear mode, piezoelectric motor 214 and single sided, rotational, shear mode, piezoelectric motor 199 are also embodiments of a collocated, rotational, shear mode, piezoelectric micro-actuator 120. When integrated into a disk drive 1 or disk drive equipment and activated by a control voltage 13, these said piezoelectric motors 199 and 214 and also said micro-actuator 120 perform fine track positioning.

The single sided, rotational, shear mode, piezoelectric motor 214 can be integrated into a suspension 7, which has a micro-actuator flex circuit 185, by electrically and mechanically connecting the top surface electrodes 167 and 168 to the two tongue bond pads 43 with conductive flexure bonding material 119, thus producing a collocated, rotational, shear mode, piezoelectric micro-actuated suspension 132.

To produce a collocated, rotational, shear mode, piezoelectric micro-actuated head 133, a head 6 is integrated with a custom micro-actuator flex circuit 185 that has its two tongue bond pads 43 bonded with conductive slider bonding material 121 to the electrodes 167 and 168 of an inverted, single sided, rotational, shear mode, piezoelectric motor 214. The other end of micro-actuator flex circuit 185 makes electrical contact to the head bond pads 22. When collocated, rotational, shear mode, piezoelectric micro-actuated head 133 is later integrated with a suspension assembly 7, flex circuit 35 of suspension assembly 7 which carries the control voltage 13 makes contact to head bond pads 22. Micro-actuator flex circuit 185 of head 6 delivers the control voltage 13 from the head bond pads 22 to the single sided, rotational, shear mode, piezoelectric motor 214.

In general, there are three methods for making electrical contact to collocated, rotational, shear mode, piezoelectric micro-actuators 120. When the positive electrode 167 and the negative electrode 168 are located on the same surface, as in single sided, rotational, shear mode, piezoelectric motor 214, the first two methods of electrical contact are through the tongue bond pads 43 near the flexure tongue 36 and through head bond pads 22. The third method of electrical connection occurs when the positive electrode 167 and the negative electrode 168 are located on opposite sides, as in rotational, shear mode, piezoelectric motor 199. In this case, electrical connection is achieved using two micro-actuator flex circuits 185, one located on the head 6 and the other on flexure 34.

The same three types of electrical connection also apply to push-pull, shear mode piezoelectric micro-actuator 160, namely the two top surface connections through the flexure tongue 36 (single sided top surface), the two bottom surface connections through head bond pads 22 (single sided bottom surface) and thirdly, one connection through each (dual sided). FIG. 9 only shows the single sided version of push-pull, shear mode, piezoelectric micro-actuator 160. To create a dual, top sided version of push-pull, shear mode piezoelectric micro-actuator 160, the top surfaces of motor 162 and motor 163 become positive electrodes 167, the polarization direction 165 on motor 163 is reversed and the electrically conductive bottom support 161 becomes the negative electrode 168.

Rotational, shear mode, piezoelectric motors 199 and 214 require circumferential polarization 200 and because circumferential polarization 200 is a new concept that has never been done before, then its manufacturing process needs description to assert it is possible to achieve. The typical manufacturing process of poling piezoelectric materials involves heating and applying a strong electric field to induce polarization 58 with either single axis (uniaxial or linear) or radial orientation. Circumferential polarization 200 is a more difficult process because electric fields in free space diverge.

Figure 13A:
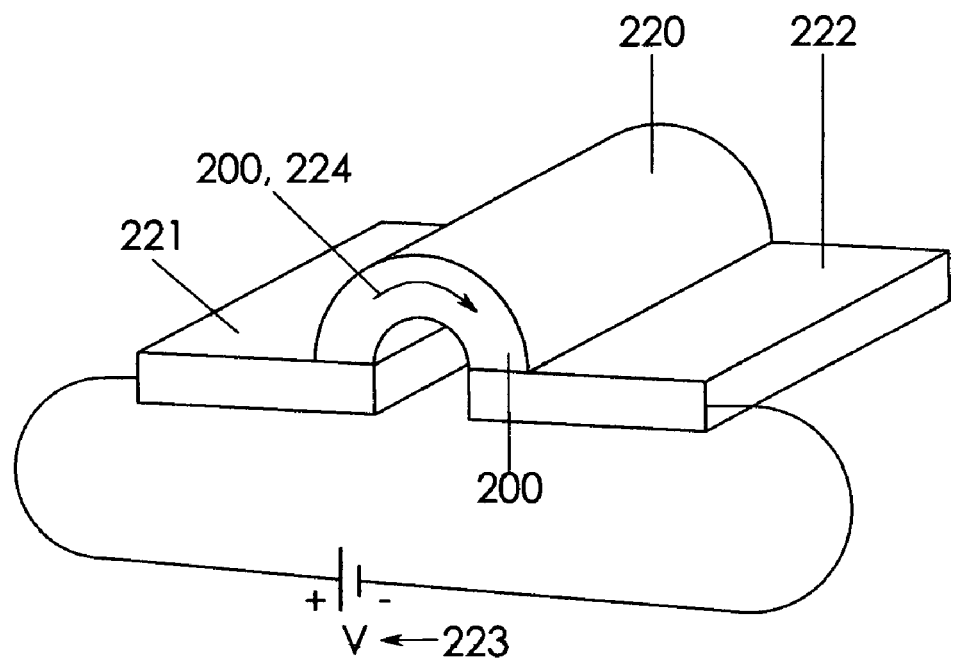
FIG. 13A illustrates a manufacturing process for inducing circumferential polarization.

FIG. 13A illustrates how the circumferential polarization 200 can be induced. Shear mode piezoelectric material 101 is machined or pressed into a rod shape having an outer radius 203. The PZT rod is then cut in half and the inner radius 202 is machined forming a half-disk rod 220. To achieve circumferential polarization 200, the half-disk rod 220 is electrically connected so as to bridge two electrodes 221 and 222. In a high temperature environment, a high voltage 223 is applied across electrodes 221 and 222. The electric field lines of force follow the shape of the half-disk rod 220 due to the high relative permittivity of the shear mode piezoelectric material 101. The circumferential electric field 224 inside the half-disk rod 220 induces circumferential polarization 200. The half-disk rod 220 with circumferential polarization 200 is subsequently bonded to another half disk rod 220 having either circumferential polarization 200 or reverse circumferential polarization 216 so that after dicing and polishing, disks 201 of thickness 204 are either a rotational, shear mode, piezoelectric motor 199 or a single sided, rotational, shear mode, piezoelectric motor 199. The final step is to deposit on disk 201 the positive electrode 167, the negative electrode 168 and if required, the bottom surface electrode 217.

Figure 13B:
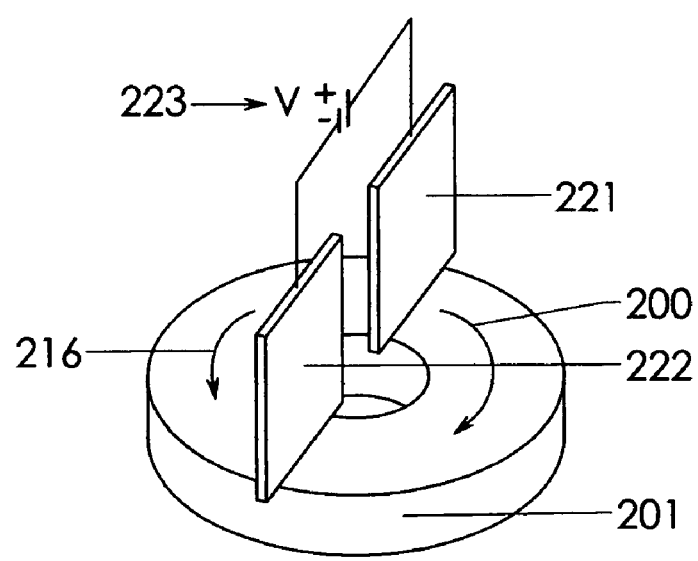
FIG. 13B illustrates a manufacturing process for inducing circumferential polarization and reverse circumferential polarization simultaneously.

FIG. 13B illustrates a manufacturing process by which single sided, rotational, shear mode, piezoelectric motor 214 can be polarized. A disk 201 made of shear mode piezoelectric material 101 with inner radius 202, outer radius 203 and final lapped to a thickness 204 is accurately positioned using the hole with inner radius 202 and then clamped onto a flat non-conductive surface with two electrodes 221 and 222 whereupon a high voltage 223 is applied at high temperature to simultaneously induce circumferential polarization 200 and reverse circumferential polarization 216 in one process step. Note that more electrodes can be used with scaled voltage potentials if the relative permittivity of the shear mode piezoelectric material 101 is not high enough to achieve the desired quality of circumferential polarization 200. The advantages of this manufacturing process are that the disk is single piece and the polarization process can be automated.

An alternative method to create circumferential polarization 200 in half-disk rod 220 is to cut a wafer of shear mode piezoelectric material 101 having linear polarization 58 into strips with trapezoidal cross-section and then bond the strips together to form an assembly of shear mode piezoelectric material pieces that linearly approximates circumferential polarization 200 and that approximates half-disk rod 220 with faceted edges. The half-disk rod 220 with linearly approximated circumferential polarization 200 is bonded to another half-disk rod 220 having either linearly approximated circumferential polarization 200 or linearly approximated reverse circumferential polarization 216 and then diced to desired thickness 204 to respectively form the linearly approximated equivalents of rotational, shear mode, piezoelectric motor 199 and single sided, rotational, shear mode, piezoelectric motor 214.

The final shape as described of rotational, shear mode, piezoelectric motor 199 and single sided, rotational, shear mode, piezoelectric motor 214 is a thin disk 201 while the two linearly approximated equivalents are a thin disk 201 with faceted edges. Other embodiments are possible. For example, a mechanical registration feature such as a pair of reference flats may be lapped on opposing sides of disk 201 to help automated assembly equipment pick up, align and bond single sided, rotational, shear mode, piezoelectric motor 199 to the tongue bond pads 43 of micro-actuator flex circuit 185. A second example of an alternative shape is an incomplete disk 201 where the circular symmetry only arcs say 270 degrees instead of a full 360 degrees. Such an incomplete disk 201 still has rotation axis 88 and rotational mechanical coupling.

Rotational, shear mode, piezoelectric motor 199 provides rotation directly without hinges or other mechanical coupling means. It is single piece (monolithic) and solid state. Integration of said motor 199 requires common assembly equipment that provides accurate positioning and adhesive attachment. Its entire top and bottom surfaces are bonded for maximum mechanical stiffness, vibration dampening, load managements and particle containment. It has no unsupported structures, hinges, beams or cantilevers that can resonate and impede advancements toward high frequency dynamic positioning.

Unsupported structures, cantilevers, hinges and beams are commonplace in prior art to convert linear motion from one axis to another axis or to convert linear motion into rotational motion. This patent teaches that an alternative to using macroscopic, shape dominated structures that transform linear motion into rotational motion is to use a more microscopic, solid state approach that relies on the elastic properties of materials. Shape dominant structures are undesired because they resonate and impede the goal of increasing frequency response.

Utilizing the bulk and shear elastic properties of materials is aided by the small displacements of shear mode piezoelectric materials 101 (in the nanometer range), the relatively small size of the collocated, rotational, shear mode, piezoelectric micro-actuator 120 (having sub-millimeter dimensions) and by finite element analysis which can be used to manage loads, maximize mechanical stiffness and tune the resonance spectrum of the integrated structure. The designer has two available technologies that help achieve these goals, namely, the flexure can be etched into almost any 2D geometry and the flex circuit 185 can be fabricated into almost any 2D shape. Examples are forthcoming.

First however, the shear mode displacement 107 and differential displacement 208 are discussed for the three types of collocated, rotational, shear mode, piezoelectric microactuators 120.

Figure 14A:
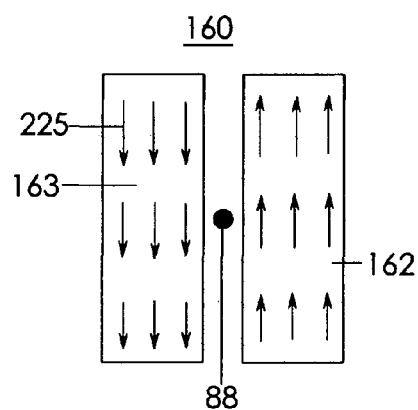
FIG. 14 illustrates the micro-mechanical displacement for three types of collocated, rotational, shear mode, piezoelectric micro-actuators.
Figure 14B:
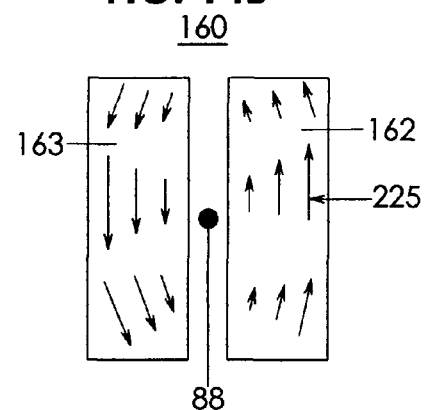

FIG. 14A illustrates the outline of shear mode piezoelectric motors 162 and 163 of push-pull, shear mode piezoelectric micro-actuator 160 with an array of displacement vectors 225 showing uniform, uniaxial displacement in a mechanically uncoupled state. When push-pull, shear mode piezoelectric micro-actuator 160 is mechanically coupled for rotation about rotation axis 88, the displacement vectors 225 in FIG. 14B increase in length with increasing radius and the vector directions are circumferential about rotation axis 88. The difference between the displacement vectors 225 in the coupled and uncoupled state at each position is indicative of the stress that develops when the applied control voltage 13 is non-zero.

Note that the magnitude and direction of the displacement vectors 225 vary with the type of mechanical coupling used. For example, when a hinge is used for mechanical coupling, the displacement vectors 225 look more like FIG. 14A than FIG. 14B and when the elastic properties of materials provides the mechanical coupling without hinges, the displacement vectors 225 look more like FIG. 14B.

Figure 14C:
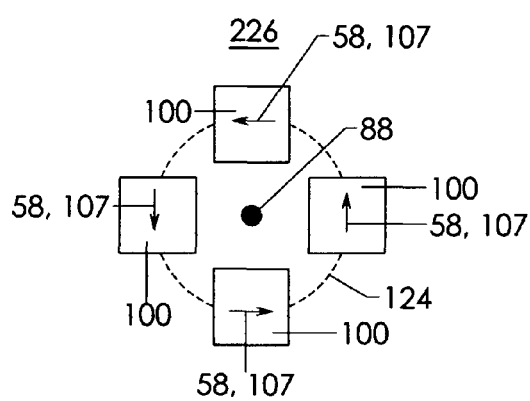

FIG. 14C illustrates a four motor version of a piecewise linear, rotational shear mode piezoelectric micro-actuator 226, defined to comprise two or more shear mode piezoelectric motors 100. While other positions are possible, the preferred embodiment has each shear mode piezoelectric motor 100 centrally positioned and equally spaced along a circle with each said motor 100 having a polarization 58 that is single axis, linear, and tangent to the circle at the center position. The center of the circle determines the desired rotation axis 88 and the radius of the circle determines the effective micro-actuator radius of rotation 124. Note that the "piecewise linear" term of piecewise linear, rotational shear mode piezoelectric micro-actuator 226 refers to the linear polarization 58 of each shear mode piezoelectric motor 100 oriented on the stated circle that together form a piecewise linear approximation to circumferential polarization 200. Push-pull, shear mode piezoelectric micro-actuator 160 is the two motor version of piecewise linear, rotational shear mode, piezoelectric micro-actuator 226 and has been separately identified because it has the least number of components. A greater number of shear mode piezoelectric motors 100 can be helpful if more displacement force is required or if more mechanical stability is needed. The piecewise linear, rotational shear mode piezoelectric micro-actuator 226 in an uncoupled state has uniform shear mode displacement 107 parallel to polarization direction 58.

Figure 14D:
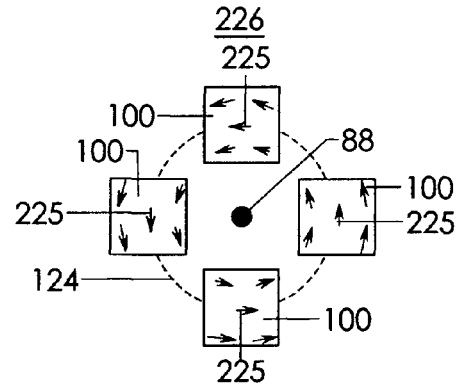

FIG. 14D illustrates piecewise linear, rotational shear mode piezoelectric microactuator 226 in a mechanically coupled state for rotation about rotation axis 88. The displacement vectors 225 increase in length with increasing radius and the vector directions are circumferential about rotation axis 88. The difference between the displacement vectors 225 in the coupled and uncoupled states at each position is indicative of the stress that develops when the applied control voltage 13 is non-zero.

As number of shear mode piezoelectric motors 100 increases, piecewise linear, rotational shear mode piezoelectric micro-actuator 226 improves its linear approximation to circumferential polarization 200 but unlike rotational, shear mode, piezoelectric motor 199, the sides of each shear mode piezoelectric motor 100 have free boundary conditions. The entire top and bottom surfaces of each shear mode piezoelectric motor 100 are tightly integrated to adjacent surfaces to maximize mechanical integration benefits.

Piecewise linear, rotational shear mode piezoelectric micro-actuator 226 is an embodiment of collocated, rotational, shear mode, piezoelectric micro-actuator 120. The individual shear mode piezoelectric motors 100 bonded along a circular pattern with flexure bonding material 119 to flexure assembly 33 at the flexure tongue 36 or with slider bonding material 121 to slider 23, internally creates the mechanical coupling for rotational displacement 122. When a control voltage 13 is applied, piecewise linear, rotational shear mode piezoelectric micro-actuator 226 exhibits rotational displacement 122 for fine track positioning in disk drives and disk drive equipment.

Figure 14E:
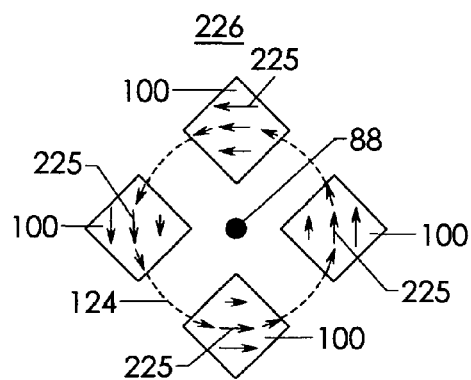

FIG. 14E illustrates the same four motor version of piecewise linear, rotational shear mode piezoelectric micro-actuator 226 in a mechanically coupled state for rotation about rotation axis 88 as in FIG. 14D but now each motor 100 is rotated 45 degrees about its own center axis. This motor configuration maximizes the motor area at the effective micro-actuator radius of rotation 124 and minimizes the motor area where the shortest and longest displacement vectors 225 are located.

It is understood that shapes other than squares are possible for each shear mode piezoelectric motor 100 comprising piecewise linear, rotational shear mode piezoelectric micro-actuator 226.

Figure 14F:
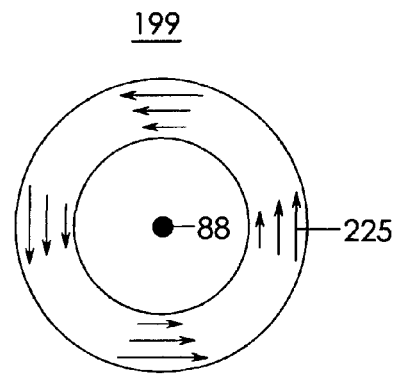

FIG. 14F illustrates the rotational, shear mode, piezoelectric motor 199 with displacement vectors 225 that increase in length with increasing radius and that have vector directions which are circumferential about rotation axis 88. The boundary conditions of rotational, shear mode, piezoelectric motor 199 with built-in rotation feature has only a mechanically coupled state. Because the displacement vectors 225 do not have identical length as compared to the free state of shear mode piezoelectric motor 100, stress develops in the structure due to differential displacement 208 as previously discussed when the applied control voltage 13 is non-zero.

The present invention of a collocated, rotational, shear mode, piezoelectric microactuator 120 has several embodiments that directly achieve rotational displacement 122 and therefore do not require mechanical coupling to generate rotational displacement 122. Other embodiments such as push-pull, shear mode piezoelectric micro-actuator 160 and to a lesser degree with increasing motor count, piecewise linear, rotational shear mode piezoelectric micro-actuator 226 can benefit from mechanical coupling designs that improve rotation. Note that simply bonding the individual shear mode piezoelectric motors 100 in place with flexure bonding material 119 to flexure assembly 33 at the flexure tongue 36 or with slider bonding material 121 to slider 23 creates the necessary mechanical coupling to generate rotational motion but rotational displacement 122 and stress levels may be less than optimal.

By way of example, several designs of stainless steel flexure 34 in the region of flexure tongue 36 will now be presented that can be integrated with micro-actuator flex circuit 185 to form a flexure assembly 33 which integrates with a push-pull, shear mode, piezoelectric micro-actuator 160 to form a collocated, rotational, shear mode, piezoelectric micro-actuated suspension 132 for the purpose of the enhancing rotational displacement 122 and distributing stress without the need for a separate mechanical coupling plate 175. In these examples, the flexure performs the function of a mechanical coupling plate.

Figure 15A:
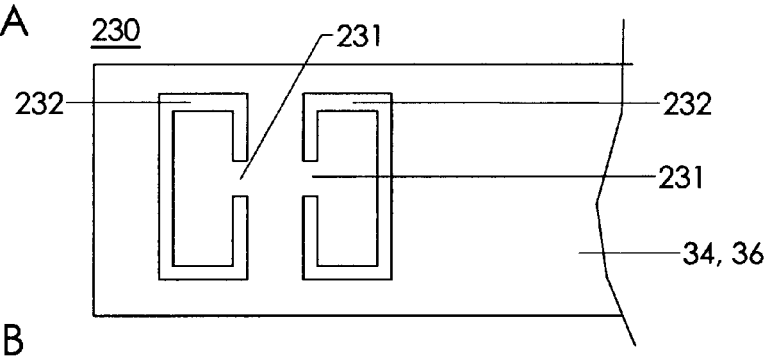
FIG. 15 illustrates several designs of stainless steel flexure.

FIG. 15A illustrates a hinged flexure 230 having two hinges 231 that result from two C-shaped etched patterns 232. The two hinges 231 convert opposing linear displacement 107 from push-pull, shear mode piezoelectric micro-actuator 160 into rotational displacement 122. Micro-actuator flex circuit 185 has conductive traces 42 and tongue bond pads 43 that appropriately match the geometries of hinged flexure 230 and push-pull, shear mode piezoelectric micro-actuator 160. In this design, the stress in the shear mode piezoelectric motors 162 and 163 due to differential displacement 208 is low and the stress in the two hinges 231 due to shear mode displacement 107 is high.

Whereas hinged flexure 230 successfully incorporates mechanical coupling plate 175, other designs are possible, such as changing the number of hinges. To further control out of plane motion, increase frequency response and suppress resonance modes, shape dominated hinged structures can be eliminated that result in a stiffer design. Stiffer flexures are designed by reducing the amount of etching and by decreasing the slot lengths. Stress throughout the pertinent structures can be managed by utilizing the elastic properties of stainless steel flexure 34 and micro-actuator flex circuit 185.

Figure 15B:
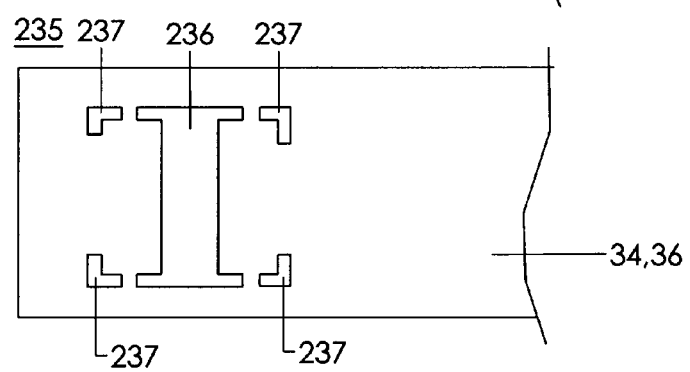
Figure 15C:
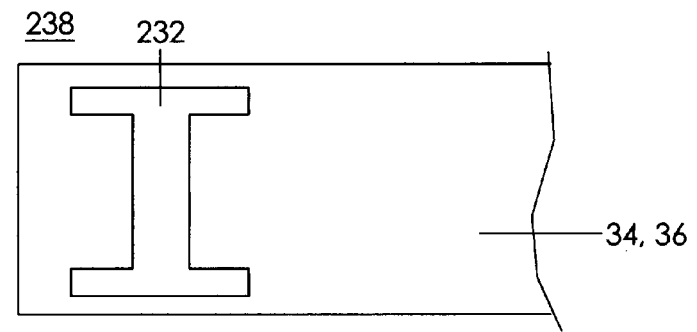
Figure 15D:
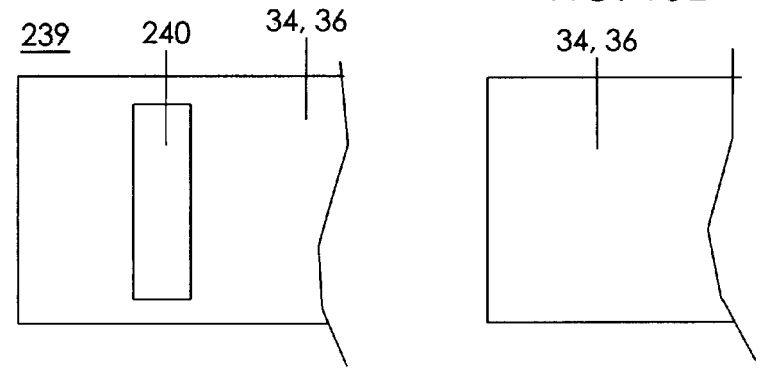
Figure 15E:
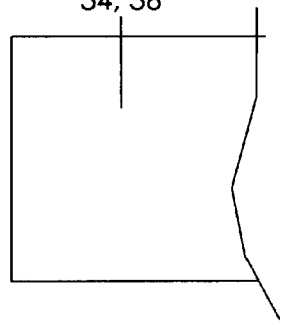

FIG. 15B though FIG. 15E show hinge-less flexure designs with increasing stiffness because less etching is done. FIG. 15B shows hinge-less flexure 235 where an I-slot 236 and four corner slots 237 are etched in flexure 34 to relieve the regions where maximum mechanical shear occurs. FIG. 15C shows hinge-less flexure 238 that has an I-slot 236 and no etched corner slots 237. FIG. 15D shows hinge-less flexure 239 that has single linear slot 240. FIG. 15E shows a normal flexure 34 with no etching. This design represents the stiffest design.

It is understood that if piecewise linear, rotational shear mode piezoelectric microactuator 226 is used in place of a push-pull, shear mode piezoelectric micro-actuator 160, the shape of the micro-actuator flex circuit 185 and the etched patterns 232, if any, of flexure 34 would be appropriately designed. Because rotational, shear mode, piezoelectric motor 199 already has rotation incorporated, a flexure 34 with no etching provides the greatest stiffness.

All three motor type embodiments of collocated, rotational, shear mode, piezoelectric micro-actuator 120 have internal stress due to differential displacement 208 when the applied control voltage 13 is non-zero. Note that other sources of stress exist such as those that are due to adhesive shrinkage during curing, the difference in each material's coefficient of thermal expansion when operating at environmental temperature extremes, and the internal stress residing in the material itself. To manage these stresses the present invention uses the elastic properties of materials and different configurations for creating a mechanical only or an electromechanical interface that integrates a collocated, rotational, shear mode, piezoelectric micro-actuator 120 with head 6 and/or flexure assembly 33.

Continuing with the example of integrating shear mode piezoelectric motor 162 of push-pull, shear mode, piezoelectric micro-actuator 160 to either the slider 34 of head 6 or the flexure assembly 33 of suspension assembly 7, three configurations of micro-actuator flex circuit 185 will now be presented that change the stiffness of the electromechanical interface. The design goal of the mechanical interface is to increase rotational displacement 122, distribute stress and help tune the frequency response spectrum.

The elastic properties are greatest in polyimide layer 42, least in the ceramic slider 23 and in-between for the stainless steel flexure 34, metal traces 42 and gold bond pads 43. The flexure bonding material 119 and slider bonding material 121 allow a large range of elastic (or inelastic) response, based upon both composition and cured thickness.

Mechanical only interfaces typically use non-conductive adhesive 207. Electromechanical interfaces typically use conductive adhesive 52. Different configurations are possible by separating the electrical and mechanical functions of the electromechanical interface.

Figure 16A:
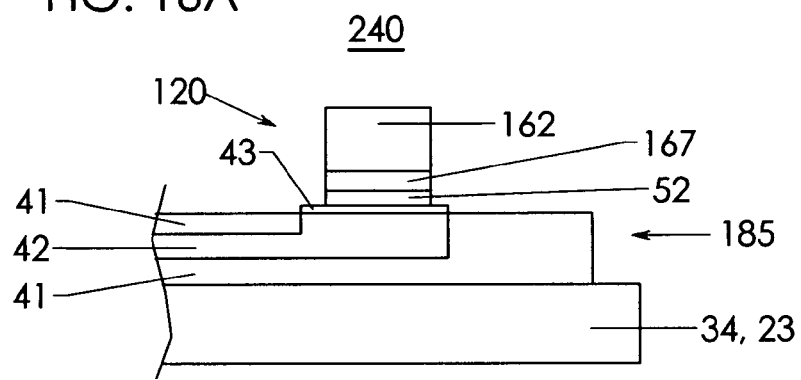
FIG. 16 illustrates three interfaces which vary the elasticity of the electromechanical connection between a micro-actuator flex circuit and a push-pull, shear mode piezoelectric micro-actuator.

FIG. 16A illustrates a flex circuit interface 240. A push-pull, shear mode, piezoelectric micro-actuator 160 with shear mode piezoelectric motor 162 and electrode 167 makes electromechanical contact with conductive adhesive 52 to tongue bond pad 43 of micro-actuator flex circuit 185. Micro-actuator flex circuit 185 can be attached to a stainless steel flexure 34 or to a ceramic slider 23 depending upon the desired electrical routing of collocated, rotational, shear mode, piezoelectric micro-actuator 120. This is a typical interface.

Figure 16B:
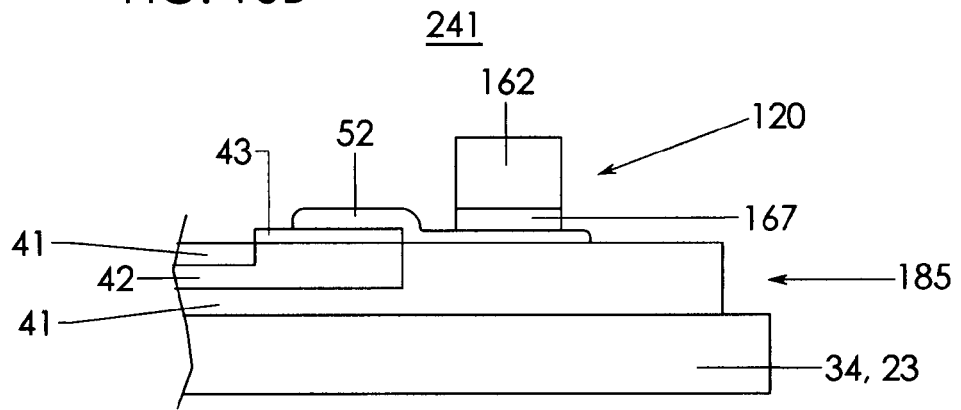

FIG. 16B illustrates a polyimide interface 241. A push-pull, shear mode, piezoelectric micro-actuator 160 with shear mode piezoelectric motor 162 and electrode 167 makes electrical contact with conductive adhesive 52 to an adjacently located tongue bond pad 43 of micro-actuator flex circuit 185. Mechanical contact is primarily with the polyimide layer 41 of micro-actuator flex circuit 185. A polyimide mechanical interface is relatively elastic.

Figure 16C:
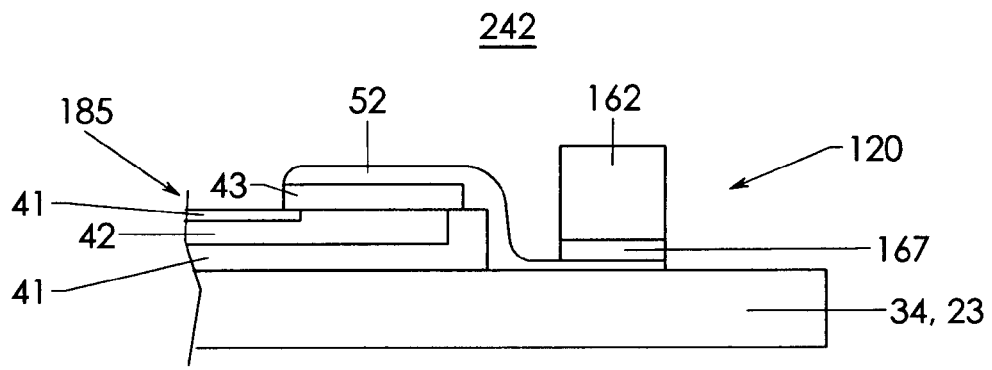

FIG. 16C illustrates a direct interface 242. A push-pull, shear mode, piezoelectric micro-actuator 160 with shear mode piezoelectric motor 162 and electrode 167 makes electrical contact with conductive adhesive 52 to an adjacently located tongue bond pad 43 of micro-actuator flex circuit 185. Mechanical contact is made directly with a stainless steel flexure 34 or ceramic slider 23 depending upon the desired electrical routing of collocated, rotational, shear mode, piezoelectric micro-actuator 120. This mechanical interface has no elastic polyimide layer in the interface and therefore is the stiffest mechanical interface of the three mentioned interfaces.

It is understood that other methods for electrical connection are available other than conductive adhesive. It is also understood that the three examples are not limiting but rather highlighting that a multitude of configurations, shapes and materials are available for optimizing the mechanical and electromechanical interfaces which are required to integrate any embodiment of collocated, rotational, shear mode, piezoelectric micro-actuator 120.

FIG. 17 illustrates the different orientations and positions in which a collocated, rotational, shear mode, piezoelectric micro-actuator 120 can be integrated into a suspension assembly 7 or head 6. Head 6 with recording element 21 establishes a reference for discussion that defines the transverse axis 74, the longitudinal axis 75, the transverse axis centerline 251 and the longitudinal axis centerline 252. Note that head 6 generally has a center of mass located at the geometric center 253.

Figure 17A:
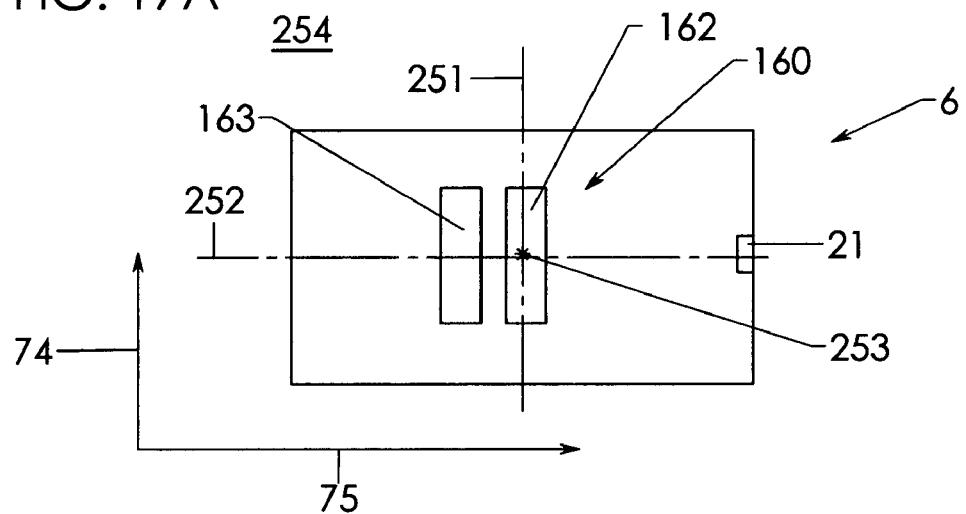
FIG. 17 illustrates different orientations and positions in which a collocated, rotational, shear mode, piezoelectric micro-actuator can be mounted.
Figure 17B:
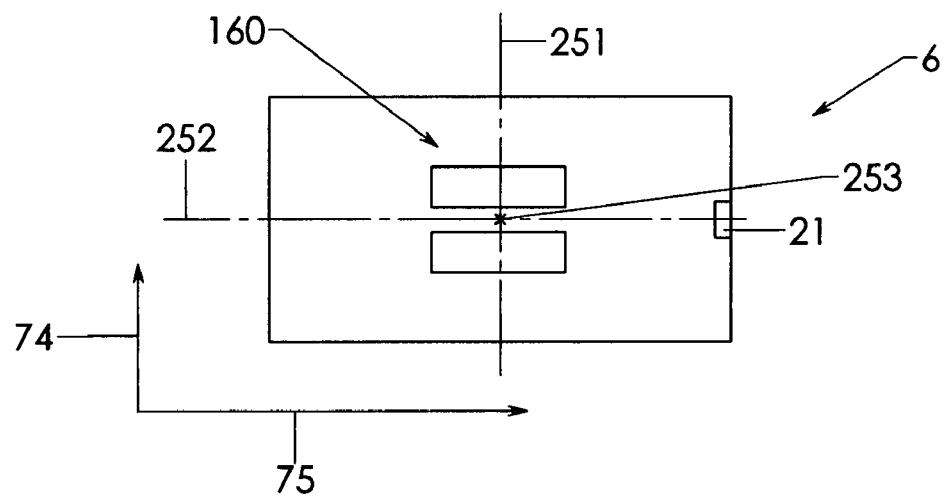
Figure 17C:
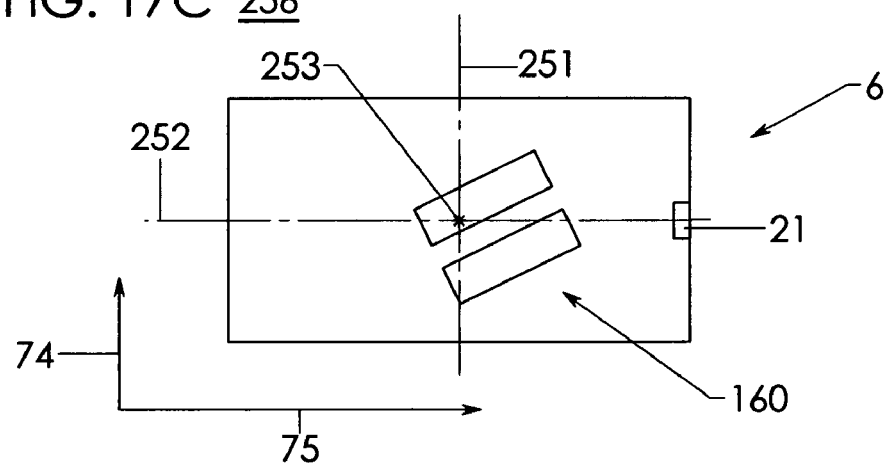

Using the footprint of the push-pull, shear mode piezoelectric micro-actuator 160 superimposed on head 6, FIG. 17A illustrates a transverse orientation 254, FIG. 17B illustrates a longitudinal orientation 255 and FIG. 17C illustrates an angled orientation 256. The longitudinal orientation 255, typically having the longest axis, affords the longest length shear mode piezoelectric motor 100.

Regarding position, FIG. 17A illustrates push-pull, shear mode piezoelectric microactuator 160 with a positioning bias on longitudinal axis 75 that is further away from recording element 21 for the purpose of increasing rotational mechanical advantage. FIG. 17B illustrates said micro-actuator 160 centered on head 6, coincident with the center of mass of head 6. Micro-actuation about the center of mass of head 6 minimizes perturbations in the suspension assembly 7. FIG. 17C illustrates the said micro-actuator 160 positioned neither on the transverse axis centerline 251 nor on the longitudinal axis centerline 252 as in the real life case involving dimensional tolerances.

Various orientations and positions are necessary to optimize performance. In some situations the center of mass may be shifted on the longitudinal axis 75 slightly towards recording element 21 because the electrical connection to head 6 at bond pads 22 adds mass and thus shifts the center of mass.

To get a better understanding of a collocated, rotational, shear mode, piezoelectric micro-actuated HGA 115, a few quantitative numbers are discussed. The disk drive industry uses standardized sizes for head 6. A femto format head 6 has a length, width and thickness of 0.85, 0.7 and 0.23 millimeter. When femto head 6 is rotated about its geometric center, the read/write element radius of rotation 125 is equal to 0.425 millimeter. Assuming an effective micro-actuator radius of rotation 124 equal to 0.1 millimeter, the mechanical advantage is 4.25. A pic0 format head 6 has a read/write element radius of rotation 125 equal to 0.625 millimeter. Using the same effective micro-actuator radius of rotation 124 equal to 0.1 millimeter, the mechanical advantage of a pico head 6 is 6.25. Mechanical advantage is increased by increasing the distance between rotation axis 88 and the read/write element radius of rotation 125 or by decreasing the effective micro-actuator radius of rotation 124, with the latter one being preferred.

Shear mode piezoelectric materials 101 have a shear mode piezoelectric strain constant in the range of 500 to 1100 picometers per volt. Assuming a shear mode piezoelectric strain constant of 840 picometers per volt and a +I-30 volt micro-positioning control voltage 13, a single layer shear mode piezoelectric motor 100 has a shear mode displacement 107 of about +I-25 nanometers. A five layer piezoelectric stack 108 has a displacement of +I-125 nanometers. With mechanical advantage of 4.25×, the total head displacement 78 exceeds 1 micrometer, which is a larger than the width of track 5.

If shear mode piezoelectric stack 108 consists of 5 layers with each layer having a thickness 0.05 millimeters, then the height of shear mode piezoelectric motor 100 is 0.25 millimeters. The length and width of motor 100 are typically less than the width of the slider. Using a length and width of 0.5 millimeters, a thickness of 0.25 millimeters and a density for shear mode piezoelectric material 101 of 7.8 grams per cubic centimeter, the mass of shear mode piezoelectric motor 100 is roughly 0.5 milligrams.

A single crystal piezoelectric material with single layer thickness of 0.1 millimeter and a shear mode piezoelectric strain constant equal to 3000 picometers per volt have a +/−30 volt displacement of +I-90 nanometers. Using a pico format head 6 with a mechanical advantage of 6.25, the total displacement is over 1 micrometer. The mass of this shear mode piezoelectric motor 100 is below 0.2 milligrams.

The rotation angle for a femto format head 6 with read/write element radius of rotation 125 of 0.425 millimeter that has a total head displacement 78 of one micrometer is less than +/−0.07 degrees. This rotation angle represents the maximum skew angle that contributes to skew angle signal loss.

FIG. 18A illustrates a collocated, rotational, shear mode, piezoelectric microactuated HGA 115 with a bend in the flexure assembly 33 that produces an offset height 260 to compensate for the added height of a collocated, rotational, shear mode, piezoelectric micro-actuator 120. Note that the technology required to precisely define bends in the flexure assembly 33 is well known by the suspension suppliers in the disk drive industry.

A collocated, rotational, shear mode, piezoelectric microactuated suspension 132 establishes the offset height 260 by meeting a co-planarity specification to plane 261 defined by the bottom surface of said micro-actuator 120 and the bottom of bond pad 262 on micro-actuated flexure 185.

The electrical connection 263 between head bond pad 22 and a corresponding bond pad 262 on micro-actuator flex circuit 185 mechanically couples the back end of the head 6 causing a resistance to rotation that collocated, rotational, shear mode, piezoelectric microactuator 120 must overcome. The rotational stiffness (displacement/force) is determined by the elastic properties and shapes of micro-actuator flex circuit 185 and electrical connection 263. Head displacement 78 for fine track positioning of read/write element 21 is typically a micrometer or less. There are several embodiments that can either increase the force or decrease the rotational stiffness. Force can be increased by increasing the control voltage 13 or by increasing the size and number of the shear mode piezoelectric motors 100. Rotational stiffness can be decreased by using wire bonding for electrical connection 263 instead of ball bonding because wire bonding is less stiff than ball bonding. Rotational stiffness can also be decreased by adding slots to the micro-actuator flex circuit 185 in vicinity of bond pad 262, which increases flexibility by creating free state boundary conditions.

FIG. 18B illustrates another embodiment of how a collocated, rotational, shear mode, piezoelectric micro-actuated suspension 132 compensates for the thickness of collocated, rotational, shear mode, piezoelectric micro-actuator 120 when making electrical contact to read/write element 21 of head 6. The micro-actuator flex circuit 185 drops down in the vicinity of bond pad 262 to make electrical connection 263 with head bond pad 22. The dropped down portion of micro-actuator flex circuit 185 is more flexible due to its free boundary edges.

The embodiments in FIGS. 18A and 18B are two of many embodiments that compensate for the thickness of collocated, rotational, shear mode, piezoelectric microactuators 120 and the rotational resistance due to electrical connection 263. The embodiments discussed should not be interpreted as being limiting.

Offset height 260 can be reduced several ways including reducing the thickness of the layers of the piezoelectric stack 108, decreasing the number of layers, increasing the applied voltage 57 in control voltage 13, increasing the mechanical advantage, reducing the spec requirement for head displacement 78, moving from a polycrystalline to a single crystal piezoelectric material 101 to get a higher shear mode piezoelectric strain constant and using thin film processing techniques to fabricate thinner piezoelectric material 101.

In summary, the individual advantages of collocation, rotation and shear mode piezoelectric motors 100 have been discussed. While prior art has used one or two features, only the present invention uses all three features. The present invention of collocated, rotational, shear mode, piezoelectric micro-actuator 120 has disclosed three embodiments, namely a rotational, shear mode, piezoelectric motor 199, a push-pull, shear mode piezoelectric micro-actuator 160 and a piecewise linear, rotational shear mode, piezoelectric micro-actuator 226 with each having further embodiments related to electrical configuration and mechanical integration. Rotational displacement 122 is achieved with hinges and without hinges. Mechanically stiff designs are achieved by maximizing adhesive bonding areas, utilizing the elastic properties of materials and avoiding the use of cantilevers and unsupported beams. With its properties of low mass, stiff mechanical integration, collocated proximity to head 6, rotation about the center of mass of head 6 and use of shear mode piezoelectric motors, collocated, rotational, shear mode, piezoelectric micro-actuator 120 can be integrated with suitable embodiments to form a collocated, rotational, shear mode, piezoelectric micro-actuated suspension 132, a collocated, rotational, shear mode piezoelectric micro-actuated head 133, and a collocated, rotational, shear mode, piezoelectric micro-actuated HGA 115 which provides the displacement, high frequency response and fine track positioning required for improved tracking in disk drives and disk drive equipment.

While various embodiments have been described above, it should be understood that they have been presented by way of example only, and not limitation. Thus, the breadth and scope of a preferred embodiment should not be limited by any of the above exemplary embodiments, but should be defined only in accordance with the following claims and their equivalents.

The invention claimed is:

1. A collocated, rotational, shear mode, piezoelectric micro-actuator comprising:
at least one shear mode piezoelectric motor having a top surface and a bottom surface thereof, said piezoelectric motor top and bottom surfaces moving laterally with respect to each other when a control voltage is applied across a positive electrode and a negative electrode of the piezoelectric motor, said micro-actuator having top and bottom surfaces thereof and generating rotational displacement of said microactuator top surface relative to said microactuator bottom surface when the control voltage is applied across the piezoelectric motor electrodes;
the micro-actuator being bonded to at least one a tongue of a flexure of a suspension and a read/write head of the suspension, and being coupled such that rotational movement of the micro-actuator about an axis causes corresponding rotational movement of the read/write head about said axis.

2. The collocated, rotational, shear mode piezoelectric micro-actuator as in claim 1 wherein said at least one shear mode piezoelectric motor is bonded to a mechanical coupling plate, the coupling plate converting linear displacement into rotational displacement of a read-write head within a disk drive suspension.

3. The collocated, rotational, shear mode piezoelectric micro-actuator as in claim 2, wherein the mechanical coupling plate comprises:
first and second tabs, each tab being affixed to a respective one of first and second piezoelectric elements; and
a cross member disposed between the two tabs and connecting the two tabs;
wherein the cross member is coupled to a read-write head to effect rotation of said read-write head.

4. The collocated, rotational, shear mode piezoelectric micro-actuator as in claim 1 wherein said at least one shear mode piezoelectric motor comprises at least two shear mode piezoelectric motors, each shear mode piezoelectric motor having a single axis, linear polarization, and wherein collectively the said shear mode piezoelectric motors form a piecewise linear approximation to circumferential polarization.

5. The collocated, rotational, shear mode piezoelectric micro-actuator as in claim 1 wherein the at least one shear mode piezoelectric motor comprises at least two shear mode piezoelectric motors, each of said motors being located on a circle whose center determines a rotation axis and each motor has a single axis, linear polarization whose direction is tangent to the circle.

6. The collocated, rotational, sheaf mode piezoelectric micro-actuator as in claim 1 wherein the at least one shear mode piezoelectric motor comprises at least two shear mode piezoelectric motors, each motor being parallel to a corresponding other one of said motors at a motor spacing distance, each motor having a linear polarization direction such that when said control voltage is applied, one motor has a displacement opposite its corresponding other motor resulting in a push-pull, shear mode piezoelectric micro-actuator.

7. In combination:
a collocated, rotational, shear mode, piezoelectric micro-actuator comprising:
at least one shear mode piezoelectric motor having a top surface and a bottom surface thereof, said piezoelectric motor top and bottom surfaces moving laterally with respect to each other when a control voltage is applied across a positive electrode and a negative electrode of the piezoelectric motor, said micro-actuator having top and bottom surfaces thereof and generating rotational displacement of said microactuator top surface relative to said microactuator bottom surface when the control voltage is applied across the piezoelectric motor electrodes;
the micro-actuator being bonded to at least one a tongue of a flexure of a suspension and a read/write head of the suspension, and being coupled such that rotational movement of the micro-actuator about an axis causes corresponding rotational movement of the read/write head about said axis; and
a suspension arm, the micro-actuator and the read/write head being mounted at the end of the suspension arm.

8. A collocated, rotational, shear mode, piezoelectric micro-actuated suspension comprising:
a load beam having a slider mounted thereto;
a flexure assembly that is coupled to said load beam;
a shear mode piezoelectric motor, the piezoelectric motor having a positive electrode and a negative electrode and having a top surface and a bottom surface that move laterally with respect to each other when a control voltage is applied across the positive and negative electrodes, the piezoelectric motor being disposed at least partially above or below at least one of a tongue of the flexure assembly and the head, the piezo electric motor further being mechanically and electrically coupled to said flexure assembly at a tongue of the flexure;
wherein said shear mode piezoelectric motor is coupled to the slider so as to cause rotational displacement of the slider for fine track positioning when the control voltage is applied across the electrodes.

9. The collocated, rotational, shear mode piezoelectric micro-actuated suspension as in claim 8 wherein the flexure assembly has a mechanical coupling means that converts shear displacement of the micro-actuator into rotational displacement of the slider.

10. The collocated, rotational, shear mode piezoelectric micro-actuated suspension as in claim 8 wherein the flexure functions as a mechanical coupling plate.

11. The collocated, rotational, shear mode piezoelectric micro-actuated suspension as in claim 8 wherein a two dimensional shape is etched into the flexure enabling the flexure to function as a mechanical coupling plate.

12. The collocated, rotational, shear mode piezoelectric micro-actuated suspension as in claim 8 wherein said piezoelectric motor is bonded to the flexure assembly at the flexure tongue, and elastic properties of the flexure assembly provide mechanical coupling for rotational displacement of the slider.

13. The collocated, rotational, shear mode piezoelectric micro-actuated suspension as in claim 8 further comprising a second shear mode piezoelectric motor that is bonded to the flexure assembly at the flexure tongue, and the flexure assembly has a hinged structure for mechanical coupling that converts shear displacement into rotational displacement of the slider.

14. A collocated, rotational, shear mode, piezoelectric micro-actuated head gimbal assembly comprising:

a load beam;
a flexure assembly that is coupled to said load beam;
a head that has a read/write element; and
a shear mode piezoelectric motor, the piezoelectric motor having a positive electrode and a negative electrode and having a top surface and a bottom surface that move laterally with respect to each other when a control voltage is applied across the positive and negative electrodes, the piezoelectric motor being disposed at least partially above or below at least one of a tongue of the flexure assembly and the head, the piezoelectric motor further being mechanically and electrically coupled to said head and said flexure assembly;
wherein said shear mode piezoelectric motor is coupled to the head so as to cause rotational displacement of said head for fine track positioning when a control voltage is applied across the electrodes.

* * * * *

UNITED STATES PATENT AND TRADEMARK OFFICE
CERTIFICATE OF CORRECTION

| | | |
|---|---|---|
| PATENT NO. | : 8,125,741 B2 | Page 1 of 1 |
| APPLICATION NO. | : 11/880179 | |
| DATED | : February 28, 2012 | |
| INVENTOR(S) | : John R. Shelor | |

It is certified that error appears in the above-identified patent and that said Letters Patent is hereby corrected as shown below:

In claim 1, column 25, line 42, after "at least one" insert -- of --.

Signed and Sealed this
Tenth Day of April, 2012

David J. Kappos
*Director of the United States Patent and Trademark Office*